United States Patent [19]

Flamig et al.

[11] Patent Number: 5,304,931
[45] Date of Patent: Apr. 19, 1994

[54] MAGNETIC RESONANCE IMAGING TECHNIQUES

[76] Inventors: Duane P. Flamig, 1411 Scottsboro La., Richardson, Tex. 75082; Steven E. Harms, 3100 Beverly Dr., Dallas, Tex. 75205

[21] Appl. No.: 15,563

[22] Filed: Feb. 9, 1993

Related U.S. Application Data

[63] Continuation-in-part of Ser. No. 743,523, Aug. 9, 1991, Pat. No. 5,202,631.

[51] Int. Cl.$^5$ .............................................. G01V 3/00
[52] U.S. Cl. ...................................................... 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,684,890 | 8/1987 | Briguet et al. | 324/309 |
| 4,703,270 | 10/1987 | Hall et al. | 324/309 |
| 4,733,190 | 3/1988 | Dembinski | 324/318 |
| 4,734,647 | 3/1988 | Yoshimura | 324/318 |
| 4,746,864 | 5/1988 | Satoh | 324/309 |
| 4,799,016 | 1/1989 | Rezvani | 324/318 |
| 4,833,409 | 5/1989 | Eash | 324/318 |
| 4,843,322 | 6/1989 | Glover | 324/309 |
| 4,857,843 | 8/1989 | Macovski | 324/307 |
| 4,987,371 | 1/1991 | Glover et al. | 324/320 |
| 5,079,505 | 1/1992 | Deimling et al. | 324/311 |
| 5,125,407 | 6/1992 | Harms et al. | 324/309 |
| 5,151,655 | 9/1992 | Harms et al. | 324/309 |
| 5,159,270 | 10/1992 | Sepponen | 324/309 |
| 5,202,631 | 4/1993 | Harms et al. | 324/309 |

OTHER PUBLICATIONS

Harms, Steven E., entitled "Three-Dimensional and Dynamic MR Imaging of the Musculoskeletal System", (Nov. 1990).
Sherry et al., "Spinal MR Imaging: Multiplanar Representation from a Single High Resolution 3D Acquisition", *Journal of Computer Assisted Tomography*: 11(5):859-862 (1987).
Tyrrell, Robert L., "Fast Three-Dimensional MR Imaging of the Knee: Comparison with Arthroscopy", *Radiology*; 166: 865-872 (1988).
Spritzer, et al., "MR Imaging of the Knee; Preliminary Results with a 3 DFT GRASS Pulse Sequence", *American Journal of Roentology*; 150:597-603 (1988).
Haggar, et al., "Meniscal Abnormalities of the Knee; 3DFT Fast-Scan GRASS MR Imaging", *American Journal of Roentology*, 150: 1341-1344 (1988).
"Method of Combines Vascular, Anatomic Data", *Diagnostic Imaging*, pp. 140-141 (Feb. 1991).

(List continued on next page.)

*Primary Examiner*—Michael J. Tokar
*Attorney, Agent, or Firm*—Konneker Bush Hitt & Chwang

[57] ABSTRACT

Method for MR imaging of an object in which various RF and magnetic field gradient pulse sequences are used to produce transverse magnetization and to generate echoes. The RF pulse sequence may include a sinusoidal waveform component defined by either $y=\sin x$, $0 \leq x \leq 4\pi$; $y=\cos x$, $0 \leq x \leq 4\pi$; or $y=\sin x$, $0 \leq x \leq \pi/2$, $y=\cos x$, $\pi/2 \leq x \leq \pi$; and a phase component defined by either $y=0$, $0 \leq x \leq 2\pi$, $y=\pi$, $2\pi \leq x \leq 4\pi$; or $y = -2\pi \cos x$, $0 \leq x \leq \pi/2$, $y = -2\pi \sin x$, $\pi/2 \leq x \leq \pi$. The selected waveform and phase components may be combined to form a first, composite RF signal and the Hilbert transform of the composite RF signal selected as a second RF signal. Alternately, the second RF pulse sequence may be comprised of first and second phase shifting linear ramps. The selected gradient magnetic field pulse sequences may include a first sinusoidal readout pulse sequence defined by $y=a \sin x$, $0 \leq x \leq n\pi$ and a second sinusoidal readout pulse sequence defined by $y=a \cos x$, $0 \leq x \leq n\pi$, first and second constant magnitude phase encoding pulse sequences, or a square wave as a readout pulse sequence and a series of positive amplitude spikes positioned at each transition for the readout pulse sequence as a phase encode pulse sequence.

58 Claims, 11 Drawing Sheets

OTHER PUBLICATIONS

Yaquinto et al., "Arterial Injury from Penetrating Trauma: Evaluation with Single Acquisition Fat-Suppressed MR Imaging", *American Journal of Roentology*, 158: 631–633 (Mar. 1992).

Pierce, et al., "Three-Dimensional Gadolinium-Enhanced MR Imaging of the Breast: Pulse Sequence with Fat Suppression and Magnetization Transfer Contrast", *Radiology* 181: 757–63 (1991).

Harms et al., "Three-Dimensional Imaging", Magnetic Resonance Imaging of the Body, Second Edition Raven Press Ltd.: 199–215 (1992).

Meyer, et al., "A Comparison of Fast Spiral Sequences for Cardiac Imaging and Angiograph", *Proceedings, Ninth Annual Meering of SMRM*, p. 403 (1990).

Jackson, et al., "Projection Reconstruction with a Twist", *Proceedings, Ninth Annual Meeting of SMRM*, p. 428 (1990).

Bruder, et al., "Reconstruction Procedures for Echo--Planar Imaging", *Proceedings, Eighth Annual Meeting of SMRM*, p. 359 (1989).

Coxon, et al., "EPI Spatial Distortion in Non-Transverse Planes", *Proceedings, Ninth Annual Meeting of SMRM*, p. 361 (1989).

Meyer, et al., "Square-Spiral Fast Imaging", *Proceedings, Eighth Annual Meeting of SMRM*, p. 362 (1989).

Noll, et al., "partial k-Space Reconstruction for Square Spiral Fast Imaging", *Proceedings, Eighth Annual Meeting of SMRM*, p. 826 (1989).

Harms et al., "Clincal Applications of a New Fat Suppressed, Steady State Pulse Sequence for High Resolution Acquisitions", *Book of Abstracts vol. 1, Society of Magnetic Resonance in Medicine*, p. 187 (Aug. 1990).

Herbert Y. Kressel, et al., ed., "New MR Pulse Sequence: Fat Suppressed Steady State", *Syllabus: Special Course, MR* 1990, Radiological Society of North America (Nov. 1990).

"RSNA '90 Meeting Notes", *Radiology* 1991, 178:599 (1991).

Harms and Muschler, "Three-Dimensional MR Imaging of the Knee Using Surface Coils", *Journal of Computer Assisted Tomography;* 10(5):773–777 (1986).

MAGNETIC RESONANCE IMAGING TECHNIQUES

CROSS REFERENCE TO RELATED APPLICATION

This application is a Continuation-in-Part of U.S. patent application Ser. No. 07/743,523, filed Aug. 9, 1991, now U.S. Pat. No. 5,202,631, entitled "Magnetic Resonance Imaging Techniques Utilizing Multiple Shaped Radiofrequency Pulse Sequences" and hereby incorporated by reference as if reproduced in its entirety.

BACKGROUND OF THE INVENTION

1. Field of the Invention

This invention relates to magnetic resonance imaging techniques and, more particularly, to magnetic resonance imaging techniques which utilize various multiple shaped radiofrequency pulse sequences, either alone or in combination with multiple shaped magnetic field gradient pulse sequences, to generate an image of an object in which selected components thereof are suppressed and/or enhanced.

2. Description of Related Art

Magnetism results from the motion of electric charges such as electrons. Electrons can produce a magnetic field either by motion along a path or by virtue of their intrinsic spin. The particles that comprise the atomic nucleus, collectively called nucleons, also have spin and magnetic moment. Because both individual nucleons and nuclei have a charge distribution, rotation or spin of this charge produces a magnetic dipole whose value is called a magnetic moment. The numeric value of the magnetic moment determines the energies of the different orientations of a nucleus in an external magnetic field. The proton is positively charged and has a relatively large magnetic moment. Although neutral, the neutron also has a net magnetic moment. A neutron's magnetic moment is about two-thirds of the value of the proton's and points against the axis of spin. When in the nucleus, like nucleons align with their spins pointing against each other. This phenomena is called "pairing" and is favored because it leads to a lower nuclear energy state. Therefore, only the unpaired, odd proton or neutron, or both, contribute their magnetic moment to the nucleus. As a consequence, only nuclei with odd numbers of protons or neutrons, or both, have a magnetic moment. The magnetic properties of nuclei become important when they are placed in external magnetic fields as the nuclei will have a tendency to align with the external field.

Resonance occurs when an amount of energy equal to the difference of energy associated with the transition between states is absorbed or released. In the case of a magnetic moment of a nucleus, transitions between parallel or "up" and anti-parallel or "down" states can occur if the correct amount of energy is absorbed or released. Because the interaction is with a magnetic element, the necessary energy can be provided by a magnetic field. One way to obtain such a field is by utilizing electromagnetic radiations. To induce resonance, the frequency f of the electromagnetic radiation must be proportional to the local magnetic field $H_L$. The particular proportionality constant which will induce resonance varies depending on the particular nucleus involved. The relationship between frequency and field is given by:

$$f = \Gamma H_L / 2\pi \qquad (2)$$

where $\Gamma$ is the magnetogyric ratio of the nucleus.

When the nuclei, originally in equilibrium with the field, are irradiated at the resonant frequency, the nuclei can adopt the anti-parallel state. When the nuclei return to equilibrium, if the field is unchanged, they will radiate emissions of the same frequency. If between excitation and radiation the field strength is changed, the nuclei will radiate a frequency corresponding to the new field value. This behavior of nuclei may be described by net magnetization vector N which characterizes the system by disregarding the state of each nucleus and considers only the net collective effect. In a magnetic field, the magnetization vector points along the field. The length of the magnetization vector is proportional to the number of nuclei in the sample and to the field strength and is inversely proportional to temperature. The length and direction of this vector characterizes the equilibrium magnetization of the sample; that is, the state that it will revert to after being disturbed if enough time is allowed to pass. This equilibrium magnetization is given by:

$$\mu^2 H / kT \qquad (2)$$

where:
 $\mu$ is the nuclear magnetic moment;
 k is Boltzmann's constant; and
 T is the absolute temperature.

This vector can be disturbed from equilibrium by the application of a second external magnetic field. If such a field is superimposed upon the first magnetic field, M will align with the new net field. As M moves to its new direction, energy stored in the nuclei of the sample is provided by the second field. When the superimposed field is removed, M returns to equilibrium and the nuclei release the stored energy to the environment, either as heat or RF energy. These two fields are called the transverse field and the longitudinal field, respectively. More specifically, the component of M that points along the main field is called the longitudinal magnetization ($M_L$) and the orthogonal component is called the transverse magnetization ($M_T$). If the transverse field is an RF field at the resonant frequency, M behaves as a top such that, as it deviates from the longitudinal axis, it precesses about it. If the main magnetic field is defined as being aligned along the z axis, then $M_T$ rotates in the x,y plane and $M_L$ is reduced from its equilibrium value. If M is rotated onto the x,y plane by a 90 degree RF pulse, $M_L$ is 0.

Immediately after an RF irradiation, $M_L$ begins to grow again towards its equilibrium value M. This growth is exponential with a time constant T1 such that:

$$M_L = M[1 - \exp(-t/T1)] \qquad (3)$$

where t is the time since irradiation.

During this process, $M_T$ decays exponentially with a time constant T2 such that:

$$M_T = M_{T0} \exp(-t/T2) \qquad (4)$$

where:

$M_{TO}$ is the value of $M_T$ immediately after irradiation; and t is the lapse time.

When a proton is aligned with the magnetic field, it gives off no signal. When a proton is perpendicular to the field, it gives off a maximum signal. The rate at which a proton realigns with the static field is called its "T1" or "T1 relaxation time". The T1 relaxation time is also called "spin-lattice" or "thermal relaxation time". The individual protons exchange fixed amounts of energy when they flip from the down to up alignment in the process of returning to equilibrium. This exchange can occur only at the resonant frequency. A molecule in the lattice surrounding the resonant nucleus appears as an oscillating electric magnetic field with frequency that depends on its thermal velocity and mean free path. Since both vary over a broad range for any one temperature, of the whole ensemble of molecules, only a small fraction provide the right oscillating fields. These then couple with the nucleus and allow the relaxation to occur. As temperature and molecular composition changes so does the distribution of velocities and mean free paths, thus affecting T1.

When a group of protons precess in phase, the voxel gives off a maximum signal. When a group of protons precess out of phase, the voxel gives off no signal. The rate at which the protons de-phase is called its "T2" or "T2 relaxation time". The T2 relaxation time is also called the "spin-spin" or "transverse relaxation time". In a perfectly uniform magnetic field, all nuclei will resonate at exactly the same frequency, but if the field is even slightly inhomogeneous, nuclei resonate at slightly different frequencies. Although immediately after an RF irradiation, the nuclei are all in phase, they soon lose coherence and the signal that is observed, decays. Any such loss of coherence shortens T2. Thus, the effects due to inhomogeneities in the external field produce a rapid decay characterized by the relaxation time T2.

Magnetic resonance has become an established method for producing an image of the internal structure of an object. Such methods have numerous applications particularly in medical diagnostic techniques. For example, the examination and diagnosis of possible internal derangements of the knee is one such application of magnetic resonance imaging techniques. Most magnetic resonance techniques for knee imaging use a two-dimensional (or "2D") acquisition with a spin-echo pulse sequence to provide T1, T2 and proton density weighted images of the knee in multiple planes, typically the sagittal (y-z) and coronal (x-z) planes. However, the selective excitation techniques used by conventional 2D methods is limited in the ability to obtain thin slices by the gradient strength of the system. Furthermore, obtaining images in non-orthogonal planes is often advantageous for proper medical diagnosis. However, to obtain images in a non-orthogonal plane, the use of 2 gradients rather than a single gradient is required to obtain a slice.

As a result of the shortcomings of 2D methods, three dimensional (or "3D") acquisitions of magnetic resonance data has been used to produce thin slice, high resolution images. See, for example, the publications to Steven E. Harms, "Three-dimensional and Dynamic MR Imaging of the Musculoskeletal System"; Harms and Muschler, "Three-Dimensional MR Imaging of the Knee Using Surface Coils", *Journal of Computer Assisted Tomography*; 10(5): 773-777 (1986) and Sherry et al., ("Spinal MR Imaging: Multiplanar Representation from a Single High Resolution 3D Acquisition", *Journal of Computer Assisted Tomography*; 11 (5) : 859-862 (1987) ; Robert L. Tyrrell, "Fast Three-dimensional MR Imaging of the Knee: Comparison with Arthroscopy", *Radiology*; 166: 865-872 (1988); Charles E. Spritzer, et al., "MR Imaging of the Knee: Preliminary Results with a 3DFT GRASS Pulse Sequence", *American Journal of Roentology*; 150:597-603 (1987); Alan M. Haggar, et al., "Meniscal Abnormalities of the Knee: 3DFT Fast-Scan GRASS MR Imaging", *American Journal of Roentology*; 150: 1341-1344 (1988).

Also disclosed in the article to Steven E. Harms entitled "Three-dimensional and Dynamic MR Imaging of the Musculoskeletal System" is a pulse sequence referred to as a "fast adiabatic trajectory in steady state" or "FATS" pulse sequence. The FATS RF pulse sequence is characterized by the utilization of non-selective opposing 20 degree adiabatic half-passage pulses that result in no effective magnetization on resonance. Because the sequence is tuned to fat, water signal is detected off resonance. See also the article entitled "Method combines vascular, anatomic data", *Diagnostic Imaging*, pgs. 140-42 (February, 1991). While the FATS type RF pulse sequence tends to suppress the fat signal, the FATS type RF pulse sequence tends to have a relatively narrow null bandwidth, thereby decreasing the effectiveness of the fat suppression since off resonance fat would not be suppressed.

The use of various k-space scanning and reconstruction procedures for MR imaging techniques have been disclosed. See, for example, the publications to Craig H. Meyer, et al., "A Comparison of Fast Spiral Sequences for Cardiac Imaging and Angiograph", *Proceedings, Ninth Annual Meeting of SMRM*, p. 403 (1990); John Jackson, et al., "Projection Reconstruction with a Twist", *Proceedings, Ninth Annual Meeting of SMRM*, p. 428 (1990); H. Bruder, et al. "Reconstruction Procedures for Echo-Planar Imaging", *Proceedings, Eighth Annual Meeting of SMRM*, p. 359 (1989); R. Coxon and P. Mansfield, "EPI Spatial Distortion in Non-transverse Planes", *Proceedings Eighth Annual Meeting of SMRM*, p. 361 (1989); Craig Meyer, et al., "Square-Spiral Fast Imaging", *Proceedings, Eighth Annual Meeting of SMRM*, p. 362 (1989); and Douglas Noll, et al., "Partial k-Space Reconstruction for Square Spiral Fast Imaging", *Proceedings, Eighth Annual Meeting of SMRM*, p. 826 (1989).

SUMMARY OF THE INVENTION

In one embodiment, the present invention is of a method of producing an image of an object in which a sinusoidal function is selected as a waveform component of an RF signal and a step function is selected as a phase component of the RF signal. The selected RF signal components are then generated to produce transverse magnetization in the object. In response to the repeated generation of the RF signal in the presence of a changing magnetic field, a series of echoes which may be used to produce an image of the object are received. In one aspect of this embodiment of the invention, the method further includes the step of randomly varying transmitter and receiver phases between successive generations of the repeated pulse sequences. In another aspect of this embodiment of the invention, the waveform component of the RF signal is defined by the equation $y = \sin x$, $0 \leq x \leq 4\pi$ and the phase component of the RF signal is defined by the equation $y = 0$, $0 \leq x \leq 2\pi$, $y = \pi$, $2\pi \leq x \leq 4\pi$ and, in yet another aspect, the waveform component of the RF signal is instead defined by the equation $y = \cos x$, $0 \leq x \leq 4\pi$. In another embodiment of the invention, the waveform and phase components are comprised of adjoining first and second generally sinusoidal sections separated from each other by a phase shift of $\pi/2$ and are preferably defined by the equations $y = \sin x$, $0 \leq x \leq \pi/2$, $y = \cos x$, $\pi/2 \leq x \leq \pi$ and $y = -2\pi \cos x$, $0 \leq x \leq \pi/2$, $y = -2\pi \sin x$, $\pi/2 \leq x \leq \pi$, respectively.

In another embodiment, the present invention is of a method of producing an image of an object in which a sinusoidal function is selected as a waveform component of an RF signal and a step function is selected as a phase component of the RF signal. The selected components are then combined to form a first, composite, RF pulse sequence. From the Hilbert transform of the composite RF pulse sequence, a second RF pulse sequence is determined. The first and second RF pulse sequences are then generated to produce transverse magnetization in the object. In response to the repeated generation of the RF signal in the presence of a changing magnetic field, a series of echoes which may be used to produce an image of the object are received. In one aspect of this embodiment of the invention, the method further includes the step of randomly varying transmitter and receiver phases between successive generations of the repeated pulse sequences. In another aspect of this embodiment of the invention, the waveform component is defined by the equation $y = \sin x$, $0 \leq x \leq 4\pi$, the phase component is defined by the equation $y = 0$, $0 \leq x \leq 2\pi$, $y = \pi$, $2\pi \leq x \leq 4\pi$ and the composite RF pulse sequence is defined by $y = \sin x$, $0 \leq x \leq 2\pi$, $y = \sin (x + \pi)$, $2\pi \leq x \leq 4\pi$). Alternately, the waveform component may be defined by the equation $y = \cos x$, $0 \leq x \leq 4\pi$ and the composite RF pulse sequence by $y = \cos x$, $0 \leq x \leq 2\pi$, $y = \cos (x + \pi)$, $2\pi \leq x \leq 4\pi$).

In yet another embodiment, the present invention is of a method of producing an image of an object in which a pulse sequence and a centering frequency is selected for an RF signal. The selected RF pulse sequence is then centered at the selected centering frequency and then generated to produce transverse magnetization in the object such that excitation of various components of the object by the transverse magnetization is controlled by the selected pulse sequence and centering frequency. In response to the repeated generation of the RF signal in the presence of a changing magnetic field, a series of echoes which may be used to produce an image of the object are received. In one aspect of this embodiment of the invention, the method further includes the step of randomly varying transmitter and receiver phases between successive generations of the repeated pulse sequences. In another aspect of this embodiment of the invention, the excitation of the components of said object by the transverse magnetization may be modified by shifting the centering frequency. In further aspects of this embodiment, the selected pulse sequence may include a generally sinusoidal waveform component, preferably one defined by either the equation $y = \sin x$, $0 \leq x \leq 4\pi$, $y = \cos x$, $0 \leq x \leq 4\pi$, or $y = \sin x$, $0 \leq x \leq \pi/2$, $y = \cos x$, $\pi/2 \leq x \leq \pi$, and a step function phase component, preferably one defined by either the equation $y = 0$, $0 \leq x \leq 2\pi$, $y = \pi$, $2\pi \leq x \leq 4\pi$ or $y = -2\pi \cos x$, $0 \leq x \leq \pi/2$, $y = -2\pi \sin x$, $\pi/2 \leq x \leq \pi$. In a related embodiment of the invention, the selected waveform and phase pulse sequences are combined to form a first, composite, RF pulse sequence. From the Hilbert transform of the composite RF pulse sequence, a second RF pulse sequence is determined. The first and second RF pulse sequences are then generated to produce the aforementioned transverse magnetization in the object.

In still yet another embodiment of the invention, the present invention is of a method of producing an image of an object in which waveform and phase components of an RF signal are selected and then combined to form a first, composite, RF pulse sequence. A second RF pulse sequence comprised of first and second linear ramping phase components is then selected. Preferably, the second RF pulse sequence is comprised of a first linear ramp defined by a linear ramp on x between zero and $2\pi$ which produces a phase shift in the first pulse sequence of $-4\pi$ at zero and zero at $2\pi$ and a second linear ramp defined by a linear ramp on x between $2\pi$ and $4\pi$ which produces a phase shift of $-4\pi$ at $2\pi$ and zero at $4\pi$. The selected RF signal components are then generated to produce transverse magnetization in the object. In response to the repeated generation of the RF signal in the presence of a changing magnetic field, a series of echoes which may be used to produce an image of the object are received. In one aspect of this embodiment of the invention, the method further includes the step of randomly varying transmitter and receiver phases between successive generations of the repeated pulse sequences.

In a further embodiment, the present invention is of a method of producing an image of an object in which first and second pulse sequences are selected as waveform and phase components of an RF signal and first and second gradient magnetic field readout pulse sequences are selected. The selected RF signal components are then generated to produce transverse magnetization in the object. In response to the repeated generation of the RF signal in the presence of the selected first and second gradient magnetic field readout pulse sequences and a phase encoding gradient magnetic field, a first spiral of k-space echoes which may be used to produce an image of the object are received. By repeatedly stepping the phase encoding gradient magnetic field and generating the RF waveform, RF phase and the first and second gradient magnetic field readout pulse sequences and the stepped phase encoding gradient magnetic field, additional spirals of k-space echoes for use in the aforementioned image production are then received. In one aspect of this embodiment of the invention, the method further includes the step of randomly varying transmitter and receiver phases between successive generations of the repeated pulse sequences. In various further aspects of this embodiment of the invention, the waveform component of the RF signal may be a sinusoidal function, preferably one defined by the equation $y = \sin x$, $0 \leq x \leq 4\pi$ and the phase component of the RF signal may be a step function, preferably one defined by the equation $y = 0$, $0 \leq x \leq 2\pi$, $y = \pi$, $2\pi \leq x \leq 4\pi$. In a still further aspect of this embodiment of the invention, the first gradient magnetic field pulse sequence may be a sinusoidal function, preferably one defined by $y = ax \sin x$, $0 \leq x \leq n\pi$ where a is the amplitude of the gradient along the x-axis where a varies linearly from zero to full gradient amplitude and the second gradient magnetic field pulse sequence may also be a sinusoidal function, preferably one defined by $y = ax \cos x$, $0 \leq x \leq n\pi$ where a is again the amplitude of the gradient along the x-axis where a varies linearly from zero to full gradient amplitude. In a related embodiment of the invention, the selected waveform and phase pulse sequences are combined to form a first, composite, RF pulse sequence. From the Hilbert transform of the composite RF pulse sequence, a second RF pulse sequence is determined. The first and second RF pulse sequences are then generated to produce the aforementioned transverse magnetization in the object.

In another embodiment, the present invention is of a method of producing an image of an object in which first and second pulse sequences are selected as waveform and phase components of an RF signal and first and second pulse magnitudes are selected for first and second constant magnitude gradient magnetic fields. The selected RF signal components are then generated to produce transverse magnetization in the object. In response to the generation of the first and second gradient magnetic fields in the presence of a third, constant magnitude, gradient magnetic field generated a first linear projection of k-space echoes is produced. Repeated stepping of the first and second pulse magnitudes for the first and second gradient magnetic fields and generation of the RF waveform and RF phase pulse sequences, the stepped first and second gradient magnetic fields and the third, constant magnitude, gradient magnetic field produces additional linear projections of k-space echoes from which an image of the object may be formed. In one aspect of this embodiment of the invention, the method further includes the step of randomly varying transmitter and receiver phases between successive generations of the repeated pulse sequences. In various further aspects of this embodiment of the invention, the waveform component of the RF signal may be a sinusoidal function, preferably one defined by the equation $y = \sin x$, $0 \leq x \leq 4\pi$ and the phase component of the RF signal may be a step function, preferably one defined by the equation $y=0$, $0 \leq x \leq 2\pi$, $y=\pi$, $2\pi \leq x \leq 4\pi$. In a related embodiment of the invention, the selected waveform and phase pulse sequences are combined to form a first, composite, RF pulse sequence. From the Hilbert transform of the composite RF pulse sequence, a second RF pulse sequence is determined. The first and second RF pulse sequences are then generated to produce the aforementioned transverse magnetization in the object.

In yet another embodiment, the present invention is of a method of producing an image of an object in which first and second pulse sequences are selected as waveform and phase components of an RF signal. A series of pulse segments alternately having positive and negative amplitudes is selected as a gradient magnetic field readout pulse sequence and a series of positive amplitude spikes positioned at each transition between positive and negative amplitude pulse segments for the gradient magnetic field readout pulse sequence is selected as a gradient magnetic field phase encoding pulse sequence. The selected RF signal components are then generated to produce transverse magnetization in the object. In response to the generation of the first and second gradient magnetic field readout pulse sequences and a phase encoding gradient magnetic field, a first plane of k-space echoes are produced. Repeated stepping of the phase encoding gradient magnetic field and generation of the RF waveform phase pulse sequences, the gradient magnetic field phase encoding and readout pulse sequences and the stepped phase encoding gradient magnetic field produces additional planes of k-space echoes from which an image of the object may be formed. In one aspect of this embodiment of the invention, the method further includes the step of randomly varying transmitter and receiver phases between successive generations of the repeated pulse sequences. In another aspect of this embodiment, the gradient magnetic field readout pulse sequence may be a square wave having equal positive and negative amplitudes. In various other aspects of this embodiment of the invention, the waveform component of the RF signal may be a sinusoidal function, preferably one defined by the equation $y = \sin x$, $0 \leq x \leq 4\pi$ and the phase component of the RF signal may be a step function, preferably one defined by the equation $y=0$, $0 \leq x \leq 2\pi$, $y=\pi$, $2\pi \leq x \leq 4\pi$. In a related embodiment of the invention, the selected waveform and phase pulse sequences are combined to form a first, composite, RF pulse sequence. From the Hilbert transform of the composite RF pulse sequence, a second RF pulse sequence is determined. The first and second RF pulse sequences are then generated to produce the aforementioned transverse magnetization in the object.

BRIEF DESCRIPTION OF THE DRAWING

The present invention may be better understood, and its numerous objects, features and advantages will become apparent to those skilled in the art by reference to the following drawing in which.

DETAILED DESCRIPTION

Figure 1:
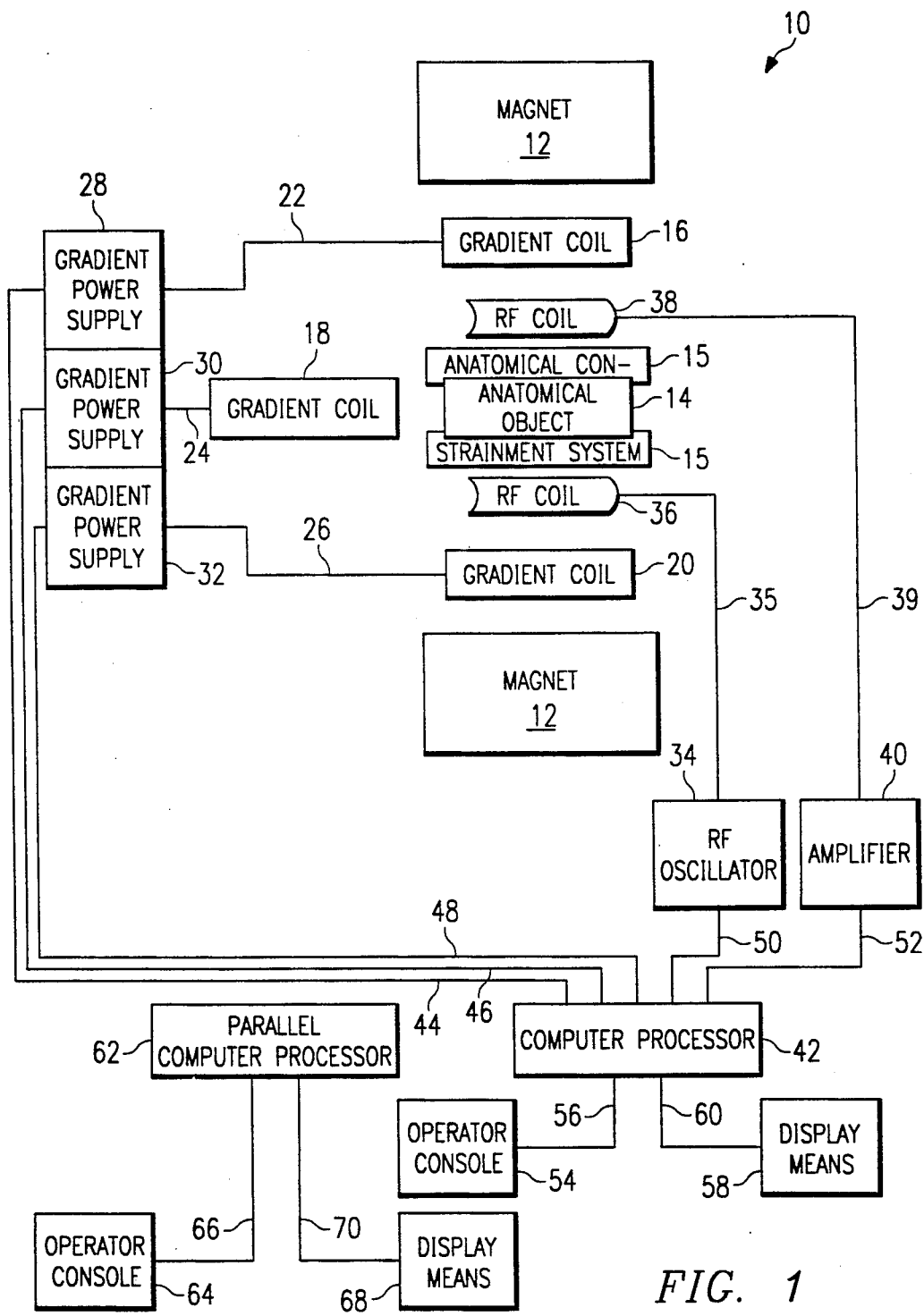
FIG. 1 is a block diagram of an apparatus for producing images of an object using magnetic resonance imaging techniques subject of the present invention.

Referring first to FIG. 1, a magnetic resonance imaging system 10 for use in conjunction with the magnetic resonance imaging techniques subject of the present invention shall now be described. As is well known in the art, magnetic resonance (or "MR") imaging requires a strong, uniform and stable magnetic field to magnetize the object being imaged. Accordingly, the MR imaging system 10 is provided with a magnet 12, for example a superconducting magnet, for generating the aforementioned strong, uniform and stable magnetic field required for magnetizing an anatomical object 14, for example, a portion of a human body such as a breast, any of the extremities (finger, hand, arm, shoulder, foot, leg), neck, head, abdomen (liver, spleen, pancreas, stomach, kidneys, colon), chest (lungs, ribs, sternum, heart), hips, or spine (cervical, thoracic, lumbar) which is to be imaged. As the MR imaging techniques and associated diagnostic and therapeutic processes described herein are most useful when the anatomical object 14 is stationary during such processes, it is preferred that the anatomical object 14 be held as stationary as possible by an anatomical constrainment system 15. It is contemplated, however, that the techniques disclosed herein may also be used to produce an MR image of immobilized or essentially non-movable objects. In such cases, no anatomical constrainment system 15 would be necessary to prevent movement of the object.

As MR imaging also requires first, second and third rapidly changing weak magnetic field gradients along x, y and z axes, respectively, the MR imaging system 10 is further provided with a first set of gradient coils 16 for generating a first rapidly changing, weak magnetic field gradient having a first selected pulse sequence along the x axis, a second set of gradient coils 18 for generating a second rapidly changing, weak magnetic field gradient having a second pulse sequence along the y axis and a third set of gradient coils 20 for generating a third rapidly changing, weak magnetic field gradient having a third pulse sequence along the z axis. Each gradient coil set 16, 18, 20 may be, for example, two coils, each with current flowing in a direction opposite to that in the other. Preferably, each gradient coil set 16, 18, 20 is configured to generate a gradient in a volume at the center of the coil sets where the constrained anatomical object 14 is positioned. The first, second and third gradient coil sets 16, 18, 20 are driven by a respective gradient power supply 28, 30, 32 connected to the corresponding gradient coil set 16, 18, 20 by an electrical connector 22, 24, 26, respectively, of conventional design. Preferably, each gradient coil subsystem 16, 22 and 28, 18, 24 and 30, 20, 26 and 32 should be configured to generate a 10mT/m or greater gradient magnetic field controllable within precise limits with rise times of one msec or better.

As MR imaging further requires the generation of a radio frequency (or "RF") field to excite nuclear spins, the MR imaging system 10 further includes a low power RF oscillator 34 capable of generating multiple RF signals having waveform, phase and/or frequency modulation characteristics as required to meet imaging needs more fully described below, an RF transmitter coil 36 which surrounds the constrained anatomical object 14 being imaged and which generates an RF signal or signals having the selected waveform, phase and frequency modulation characteristics, and an RF receiver coil 38 which also surrounds the constrained anatomical object 14 but which is electrically isolated with respect to the RF transmitter coil 36. As the RF magnetic field generated by the RF transmitter coil 36 must be 90° to the uniform magnetic field generated by the magnet 12, the shape of the RF transmitter coil 36 may be varied according to the direction of the uniform magnetic field with respect to the axis of the constrained anatomical object 14. The RF oscillator 34 supplies RF power to the RF transmitter coil 36 via an electrical connector 35 where the RF magnetic field is transmitted into the object for exciting spins.

K-space echoes are detected by the RF receiver coil 38, and transmitted via an electrical connector 39 to a low noise electronic amplifier 40 for digitization of the detected K-space echoes. For example, the RF field and K-space echoes may be acquired using a Signa 1.5 Tesla Imager manufactured by General Electric Medical Systems of Milwaukee, Wis. The aforementioned Signa 1.5 Tesla Imager is typically used in conjunction with a transmit-receive coil, also manufactured by General Electric Medical Systems, which is typically varied depending on the particular body area being imaged. For example, a quadrature transmit-receive head coil is to be used for cranial and foot examinations; a quadrature transmit-receive body coil is used for imaging of the thighs and pelvis; a linear or quadrature transmit-receive extremity coil is preferably used in connection with the imaging of the breast, knee, calf, ankle, arm and wrist; and receive-only surface coils are preferably used for the examination of the spine, shoulder and neck.

The first, second and third gradient coil systems 16, 22 and 28, 18, 24 and 30, and 20, 26 and 32, as well as the RF transmitter coil 36 and RF receiver coil 38 are controlled by a computer processor 42 via a corresponding electrical connector 44, 46, 48, 50 and 52, respectively. Typically, the computer processor 42 will include sequence control means for generating first, second and third voltage waveforms for selective transmission to the first, second and third gradient power supplies 28, 30 and 32 where first, second and third gradient magnetic field pulse sequences corresponding to the selected voltage waveforms are produced for transmission by the first, second and third gradient coil sets 16, 18 and 20, respectively. The computer processor 42 will further include means for generating multiple shaped RF pulse sequences which may include waveform, phase and/or frequency modulation, for transmission to the RF oscillator 34. Finally, the computer processor 42 will also include means for receiving the digitized detected k-space echoes from the amplifier 40 and means for transferring the received digitized detected k-space echoes to a parallel computer processor 62 for processing. The computer processor 42 is connected to an operator console 54, for example, a keyboard of conventional design, by an electrical connector 56 and display means 58, for example a CRT of conventional design, by an electrical connector 60. The operator of the console 54 controls the propagation of the appropriate RF and gradient magnetic fields necessary to produce a series of echoes which may be used to produce a time domain, three dimensional MR image or images of the constrained anatomical object 14. A computer processor 42, operator console 54 and display means 58 which shall be satisfactory for the uses contemplated herein, is the Model 3/260 workstation equipped with a TAAC accelerator manufactured by Sun Microsystems of Mountain View, Calif.

As previously set forth, the computer processor 42 transmits the digitized detected k-space echoes received thereby to the parallel computer processor 62 where the k-space echoes are processed, in a manner more fully described below, to generate a spatial domain, three dimensional MR image or images of the constrained anatomical object 14. More specifically, the computer processor 62 reconstructs spatial domain three dimensional MR images from the digitized time domain detected k-space echoes using various data processing techniques which corrects for Fourier truncation artifacts, under-sampling of k-space, residual chemical shift artifacts, spatial imperfections and quadrature detection of the MR signal and then transforms the processed data from t-k space into x-f space by application of the fast Fourier transform.

In addition to the aforementioned data processing, and as to be more fully described below, the parallel computer processor 62 is configured to perform diagnostic and therapeutic tasks, for example, in connection with the detection, biopsy and treatment of cancerous masses in the constrained anatomical object 14. Like the computer processor 42, the parallel computer processor 62 is connected to an operator console 64, for example, a keyboard of conventional design, by an electrical connector 66 and display means 68, for example a CRT of conventional design, by an electrical connector 70. As to be more fully described below, the operator of the console 64 may perform diagnostic tasks by computer controlled manipulation of multiple three dimensional MR images of the constrained anatomical object 14 reconstructed by the parallel computer processor 62 and displayed on the display means 68. Additionally, the operator of the console 64 may perform therapeutic tasks using a virtual reality image of the anatomical constrainment system 15, the constrained anatomical object 14 and any lesions detected during the aforementioned diagnostic tasks. A Power Visualization system manufactured by IBM Corporation of Yorktown, N.Y. will be satisfactory for use as the parallel computer processor 62, the operator console 64 and the display means 68. Finally, if direct filming of the images displayed on the display means 68 are desired, a laser camera may be used to photograph the displayed images.

Figure 2:
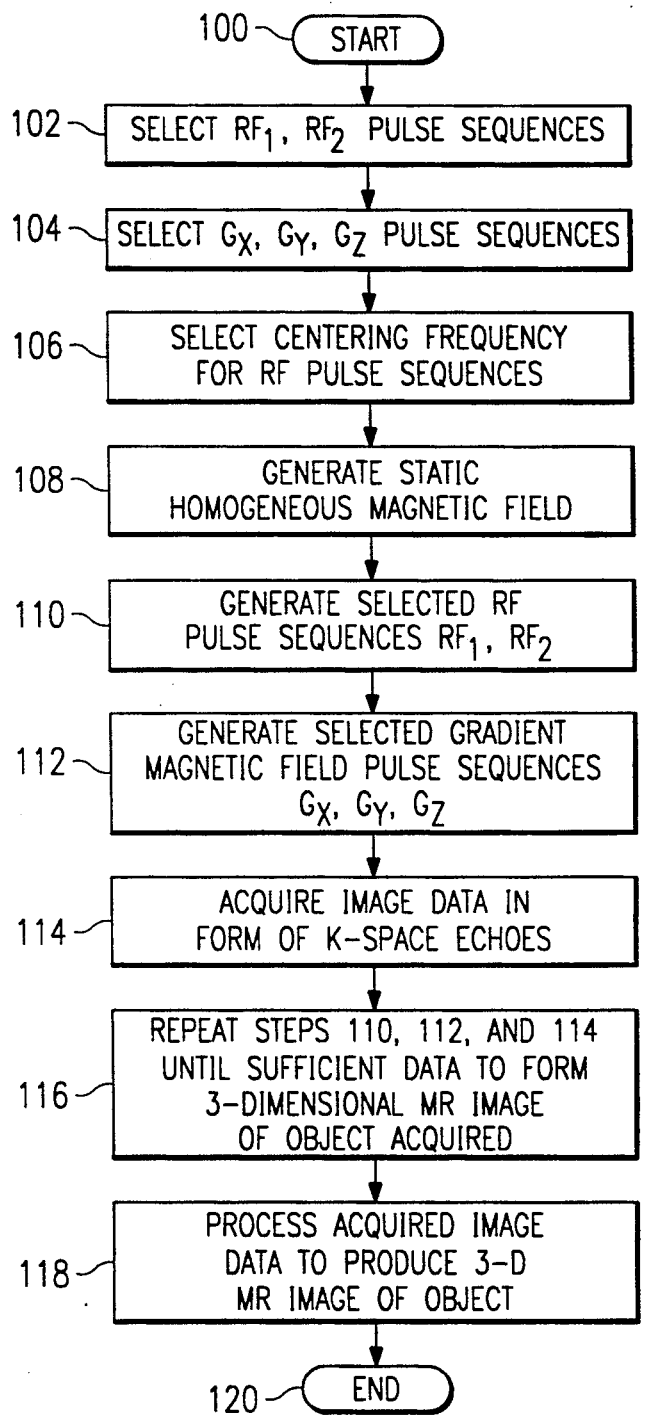
FIG. 2 is a flow chart of a magnetic resonance imaging technique in which multiple shaped radiofrequency pulse sequences, either alone or in combination with multiple shaped magnetic field gradient pulse sequences are used to produce images of an object in accordance with the teachings of the present invention.

Referring next to FIG. 2, the magnetic resonance imaging techniques utilizing multiple shaped RF pulse sequences, either alone or in combination with multiple shaped gradient magnetic field pulse sequences, subject of the present invention shall now be described in greater detail. The MR imaging techniques described herein may be briefly described as a method for producing an MR image of an object which includes the steps of selecting first and second RF pulse sequences, a centering frequency for the RF pulse sequences and first, second and third gradient magnetic field sequences based upon the characteristics of the object to be imaged and the time available to image the object. The selected first and second RF pulse are centered at the selected centering frequency and generated to produce transverse magnetization within the object. The first, second and third gradient magnetic field pulse sequences are then generated to produce a series of echoes which are then processed to form an image of the object. When receiving the image forming echoes, the intensity of certain components of the object will be modified in accordance with certain prior objectives considered when selecting the aforementioned pulse sequences and centering frequency.

The RF pulse sequences, centering frequency and magnetic field gradient pulse sequences disclosed herein, when selected and then later utilized to produce an image of the object, permit a significant amount of control over the extent to which selected chemical components of the object may be suppressed and/or enhanced during image production and the time required to produce the image of the object. Specifically, the disclosed RF pulse sequences may be utilized to produce a "null" at a selected frequency which will suppress imaging of a component at that frequency. The null frequency selected to maximize the extent of fat suppression, for example, by centering the RF pulse sequences at the resonant frequency of fat. The depth of the null may also be modified in order to change the extent to which the fat signal is suppressed and the bandwidth of the null widened in order to suppress off-resonance fat. Finally, the disclosed RF pulse sequences may be utilized to excite off-resonance components such as water.

The various techniques to be more fully set forth below provide a significant amount of flexibility in choosing the amount of excitation on and off resonance and the degree of suppression on and off resonance. As a result, the MR imaging techniques disclosed herein are particularly well suited for use in the areas of breast diagnosis, vascular imaging, musculoskeletal imaging, neuroimaging and therapy. In breast diagnosis, the MR images produced in accordance with the teachings of the present invention are useful for the diagnostic evaluation of breast abnormalities for identification, localization and characterization of lesions and, in particular for the diagnosis of lesions not visible using conventional mammography techniques or in patients that cannot be well imaged by mammography. Furthermore, when used in conjunction with the injection of contrast agent gadolinium diethylentriamine pentaacetic acid (or "Gd-DPTA") into the tissue during the generation of the RF pulse sequence and post-echo collection processing techniques such as maximum intensity projection, surface rendering and segmentation visualization, such tumors within the breast tissue will be clearly visible in the resultant images.

In vascular imaging, the present invention may be used in diagnostics, or in combination with processing techniques such as maximum intensity projection, may produce images, either slices or vascular specific images, to diagnose abnormalities in blood vessels. The techniques described herein may also be used to produce high quality MR angiograms because of the improved suppression of fat which increases diagnostic utility of MR angiograms. In musculoskeletal imaging, the present invention may be used for diagnostic evaluations of joints such as the knee, ankle, foot, hip, shoulder, elbow, wrist and hands and may be used to produce images that improve identification, localization and characterization of disorders. For example, image data from diagnostic examinations of musculoskeletal masses and bone marrow abnormalities can be used in the reconstructed slice method or combined with image processing to render three dimensional viewing, lesion specific analysis, and/or vascular images. In neuroimaging, the present invention may be used for diagnostic imaging of cranial, head and neck, orbital, spinal, and peripheral nervous system abnormalities for identification, localization, and characterization of lesions using reconstructed slices or image processing to yield volume displays, vascular images, or lesion therapy.

Finally, it is further contemplated that the method of producing MR images of tissue utilizing multiple shaped RF pulse sequences may be used in diagnostic and therapeutic applications set forth in greater detail below. The MR imaging techniques disclosed herein may be combined with treatment techniques including, but not limited to, ablation techniques, for example, laser ablation treatment, laser or radiofrequency delivered hyperthermia, ultrasonic treatment, or radiation to control the localization and delivery of therapy in the destruction of a lesion. More specifically, it is contemplated that MR images may be produced and utilized as a guide in the application of therapy. For example, in removing a lesion from surrounding healthy tissue, MR images may be produced in real time using the techniques described herein and then utilized to distinguish the boundaries of a lesion. Then, using a therapeutic delivery system, for example, laser treatment, the lesion may be removed without the unintentional removal of healthy tissue by observing the lesion/healthy tissue boundary and location of the therapeutic delivery system visible in the produced image followed by the controlled removal of the lesion only, again by carefully observing the lesion/healthy tissue boundary and the location of the therapeutic delivery system.

Specifically referring now to FIG. 2, the method of MR imaging where selected RF pulse sequences, when centered around a selected centering frequency, may suppress and/or excite chemical components in tissue, for example, fat and/or water, during the generation of echoes, the acquisition of which is controlled by selected gradient magnetic field pulse sequences which maximizes data acquisition while minimizing acquisition time commences at step 100 and, at step 102, RF pulse sequences $RF_1$ and $RF_2$, which comprise the generated RF signal are selected based upon the characteristics, for example, the frequency dispersion of the fat and water components, of the object 14 to be imaged. Further details regarding the various RF pulse sequences $RF_1$ and $RF_2$ which may be selected here and specific examples of the selection of various pulse sequences based upon the characteristics of the object 14 to be imaged and the images produced thereby shall be described with respect to FIGS. 4A-F, below.

Proceeding to step 104, first, second and third gradient magnetic field pulse sequences $G_X$, $G_Y$ and $G_Z$ for respective generation along the X, Y and Z axes of the object 14 are selected based upon desired characteristics of the echo data to be acquired. As to be more fully described below, selection of various magnetic field gradient pulse sequences will modify the locations at which k-space echoes will be acquired and will also affect the time required to acquire sufficient k-space echoes to form a 3-D image of the object 14. Further details regarding the various magnetic field gradient pulse sequences $G_X$, $G_Y$ and $G_Z$ which may be selected here shall be more fully described with respect to FIGS. 3-15, below.

At step 106, the centering frequency for the previously selected RF pulse sequences $RF_1$ and $RF_2$ are selected. As previously stated, the most commonly selected centering frequency at which a null would be produced would be the resonance frequency for fat. As to be more fully described below, however, it is often desirable to shift the centering frequency to one side of the fat resonance frequency. The centering frequency may be shifted by proper adjustment of the RF oscillator 34 before generation of the selected RF pulse sequences.

Proceeding to step 108, and assuming that the center of the object 14 being imaged is the origin of a Cartesian coordinate system, a static homogenous magnetic field directed along the z axis of the Cartesian coordinate system is generated and, at step 110, an RF signal is generated by the RF transmitter coil 36 to create transverse magnetism within the object 14. Specifically, the RF transmitter coil 36 simultaneously generates the previously selected $RF_1$ and $RF_2$ pulse sequences in the presence of the uniform magnetic field to produce the aforementioned transverse magnetism. Proceeding to step 114, gradient magnetic fields $G_X$, $G_Y$ and $G_Z$ are generated along the x, y and z axes, respectively, of the Cartesian coordinate system. As to be more fully described below, the generated gradient magnetic fields may include various combinations of phase encoding gradient magnetic fields directed along certain axis or axes, and the gradient magnetic field readout pulse sequences directed along the remaining axis or axes.

Generation of the selected gradient magnetic field pulse sequences $G_X$, $G_Y$ and $G_Z$ permit the acquisition of time domain image data by the RF receiver coil 38 in the form of series of k-space echoes at step 114 and, at step 116, the generation of RF pulse sequences $RF_1$, $RF_2$, and gradient magnetic field pulse sequences $G_X$, $G_Y$ and $G_Z$ and the acquisition of k-space echoes (steps 110, 112 and 114) are repeated until sufficient data necessary to form a 3-D image of the object 14 is acquired. In repeating steps 110, 112, 114, it is anticipated that the selected pulse sequences $RF_1$, $RF_2$, $G_X$, $G_Y$ and $G_Z$ will be played out various numbers of times, depending on the particular combination of sequences previously selected. Further details regarding the number of times a combination of pulse sequences must be played out in order to acquire sufficient data to produce a 3-D image of the object 14 will be addressed with reference to each specific pulse sequence disclosed below.

Continuing to step 118, the image data acquired by the RF receiver coil 38 will be transmitted, via the computer processor 42, to the parallel computer processor 62 for processing.

The acquired data may be viewed as a matrix of data which is processed by the processor 62 to determine the signal intensity at x,y,z locations of a spatial domain, three dimensional image of the object 14. To do so, the data matrix is transformed into a series of frequency data views in the frequency domain by applying a first series of Fourier transforms in the time direction. The image of the object is produced by applying a second and third series of Fourier transforms. After forming an image of the object 14, the method subject of the present invention ends at step 120.

Referring next to FIGS. 3A-E, a first embodiment of selected pulse sequences $RF_1$, $RF_2$, $G_X$, $G_Y$ and $G_Z$ will now be described. As may now be seen in FIG. 3A, the generated RF signal is comprised of first and second pulse sequences $RF_1$ and $RF_2$, each of which may differ in various embodiments of the invention described below with respect to FIGS. 4A-F. RF pulse sequences $RF_1$ and $RF_2$ are simultaneously generated to produce transverse magnetization in the object 14 to be imaged. First and second magnetic field gradient phase encoding pulses $G_X$ (also commonly known to as the slice encoding pulse) and $G_Z$ are set at an initial value and then generated along the X and Z axes, respectively, of the object 14 in the presence of a dephasing portion of a magnetic field gradient readout pulse $G_Y$ generated along the Y axis of the object 14. Most commonly, the initial setting of the first and second magnetic field gradient phase encoding pulses $G_{X-1}$ and $G_{Z-1}$ correspond to the application of those pulses full force in a positive direction along the X and Z axes, respectively. Magnetic field gradient phase encoding pulses $G_X$ and $G_Z$ then return to zero while the magnetic field gradient readout pulse sequence $G_Y$ goes positive to acquire k-space echoes. Echo acquisition continues in k-space until the magnetic field gradient readout pulse sequence $G_Y$ returns to zero and the acquisition of a line of k- space echo data is complete. Rewinder gradients of equal magnitude, but in the opposite direction to the phase encoding gradients, are then generated along the $G_X$ and $G_Z$ axes, respectively, prior to a next echo acquisition period. If desired, a spoiler pulse (not shown) may be applied along the X axis to spoil the steady state RF generated spin echo before initiation of a next echo acquisition period.

The above-described sequence is then repeated or "played out" a number of times until sufficient echo data has been acquired. In the first iteration, the magnetic field gradient phase encoding pulse $G_{X-1}$ was applied at full strength in a positive direction. In a first series of successive iterations, $G_X$ is varied between M different settings while the prior settings for $RF_1$, $RF_2$, $G_Z$ and $G_Y$ are repeated. For example, if the initial setting $G_{X-1}$ was full strength in the positive direction, in successive settings, the strength of $G_X$ should be gradually lowered until, during phase encoding pulse $G_{X-(M/2)}$, $G_X$ is turned off and during the last phase encoding pulse $G_{X-M}$, $G_X$ is applied full force in a negative direction. $G_X$ is then re-set to its original setting $G_{X-1}$ while $G_Z$ is changed to a next setting $G_{X-2}$. In a next series of iterations, $G_X$ is again varied between 1 and M while $G_Z$ is held at $G_{Z-2}$ and $RF_1$, $RF_2$ and $G_Y$ are held at their prior settings, thereby acquiring a next line of k-space echo data. This sequence is repeated for N values of $G_Z$ where $G_{Z-1}$ is full strength in the positive direction, $G_{Z-(N/2)}$ is turned off and $G_{Z-N}$ is full strength in the negative direction. Thus, the $RF_1$, $RF_2$ and $G_Y$ pulse sequences are played out a total of MN times. Suitable values for M and N for the object 14 to be imaged are 128 and 128, respectively.

The above-described $RF_1$, $RF_2$, $G_X$, $G_Y$ and $G_Z$ pulse sequences assume that the transmitter and receiver phase are held constant between successive generations of the pulse sequences. In a further embodiment of the invention, it is contemplated that the RF transmitter and receiver phases may be varied between successive generations of the pulse sequences by selective adjustment of the RF oscillator 34, for example, to randomly step the RF transmitter and receiver between 0° and 360°.

Figure 3A:
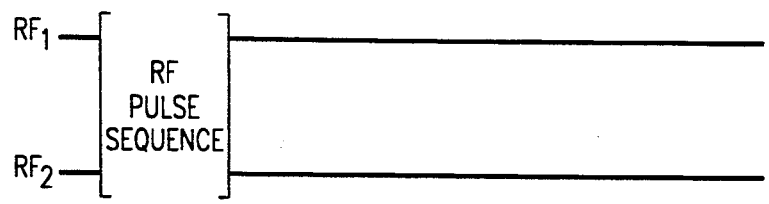
FIG. 3A is a schematic diagram of multiple shaped radiofrequency pulse sequences $RF_1$, $RF_2$ which are generated to produce transverse magnetization within an object to be imaged in accordance with a first embodiment of the magnetic resonance imaging technique of FIG. 2.
Figure 4A:
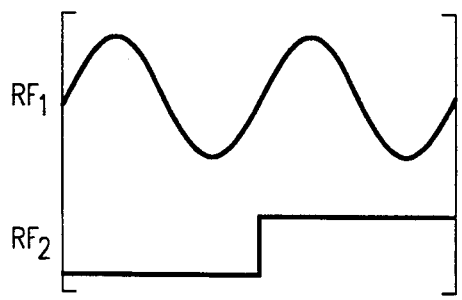
FIG. 4A is a expanded schematic diagram of a first embodiment of the multiple shaped radiofrequency pulse sequences $RF_1$, $RF_2$ of FIG. 3A also referred to as the RODEO pulse sequence.

Referring next to FIGS. 4A-4F, various embodiments of the $RF_1$ and $RF_2$ pulse sequence disclosed in FIG. 3A will now be described in greater detail. In FIG. 4a, one embodiment of a pulse sequence herein referred to as a RODEO (or "Rotating delivery of excitation off-resonance") pulse sequence may now be seen. The illustrated pulse sequence is comprised of a waveform component $RF_1$ and a phase component $RF_2$. $RF_1$ has the shape and amplitude of a sine function which extends from 0 to $4\pi$ radians. $RF_2$ is shaped as a step function which steps from 0 to $\pi$ at $2\pi$ radians. As $RF_2$ is a phase component, however, the step function represents a $\pi$ radian shift in $RF_1$ at the midpoint, i.e. $2\pi$, of the $RF_1$ pulse sequence. It should be noted, however, that while a particular embodiment of the RODEO pulse sequence illustrated in FIG. 4A, it is specifically contemplated that the term RODEO pulse sequence is intended to encompass all RF pulse sequences which include a generally sinusoidal waveform component, regardless of length or starting point on the sinusoidal curve, in combination with a phase component which produces a $\pi$ radian shift in the waveform component for half (or $2\pi$) of every $4\pi$ length thereof. Accordingly, the RODEO pulse sequence illustrated in FIG. 4A may be more accurately described as a variant, herein referred to as a RODEOSIN pulse sequence, of the broader RODEO pulse sequence.

Figure 4C:
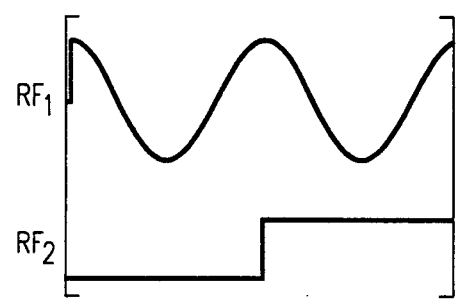
FIG. 4C is a expanded schematic diagram of a third embodiment of the multiple shaped radiofrequency pulse sequences $RF_1$, $RF_2$ of FIG. 3A also referred to as the RODEOCOS pulse sequence.
Figure 4B:
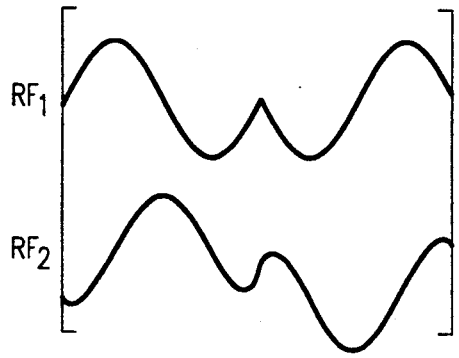
FIG. 4B is a expanded schematic diagram of a second embodiment of the multiple shaped radiofrequency pulse sequences $RF_1$, $RF_2$ of FIG. 3A also referred to as the RODEO HILBERT pulse sequence.

Referring next to FIG. 4B, a variant of the RODEO pulse sequence of FIG. 4A herein referred to as a RODEO HILBERT pulse sequence may now be seen. To form this pulse sequence, the waveform component $RF_1$ and the phase component $RF_2$ of the RODEO pulse sequence are combined to form a composite pulse sequence $RF_1$. The $RF_2$ pulse sequence is then formed by determining the Hilbert transform of the $RF_1$ pulse sequence. Again, it should be noted that while a particular embodiment of the RODEO HILBERT pulse sequence is illustrated in FIG. 4B, it is specifically contemplated that the term RODEO HILBERT pulse sequence is intended to encompass all RF pulse sequences which include a composite pulse sequence $RF_1$ which combines the waveform and phase components of any RODEO pulse sequence and a second pulse sequence $RF_2$ which represents the Hilbert transform of the composite pulse sequence.

Referring next to FIG. 4C, another variant of the RODEO pulse sequence of FIG. 4A may now be seen. This particular variant, herein referred to as a RODEOCOS pulse sequence is comprised of an waveform component $RF_1$ which has the shape and amplitude of a cosine function which extends from 0 to $4\pi$ radians and a phase component $RF_2$ shaped as a step function which steps from 0 to $\pi$ at $2\pi$ radians. As $RF_2$ is a phase component, however, the step function represents a $\pi$ radian shift in $RF_1$ at the midpoint, i.e. $2\pi$, of the $RF_1$ pulse sequence.

Figure 4D:
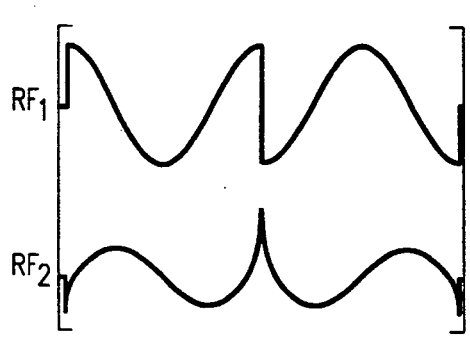
FIG. 4D is a expanded schematic diagram of a fourth embodiment of the multiple shaped radiofrequency pulse sequences $RF_1$, $RF_2$ of FIG. 3A also referred to as the RODEOCOS HILBERT pulse sequence.

Referring next to FIG. 4D, a variant of the RODEOCOS pulse sequence of FIG. 4C herein referred to as a RODEOCOS HILBERT pulse sequence may now be seen. To form this pulse sequence, the waveform component $RF_1$ and the phase component $RF_2$ of the RODEOCOS pulse sequence are combined to form a composite pulse sequence $RF_1$. The $RF_2$ pulse sequence is then formed by determining the Hilbert transform of the $RF_1$ pulse sequence.

Figure 4E:
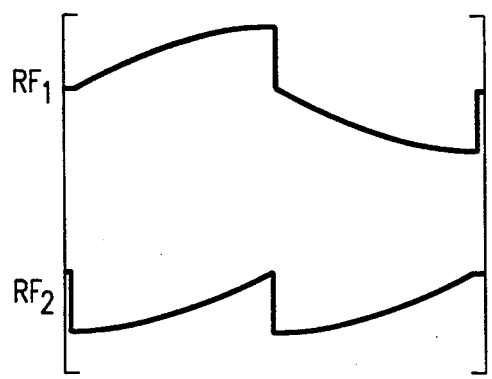
FIG. 4E is a expanded schematic diagram of a fifth embodiment of the multiple shaped radiofrequency pulse sequences RF$_1$, RF$_2$ of FIG. 3A also referred to as the SAIL pulse sequence.

Referring next to FIG. 4E, still yet another variant, herein referred to as a SAIL pulse sequence may now be seen. To form this pulse sequence, the waveform component $RF_1$ is constructed of the sin function from 0 to $\pi/2$ and of the cosine function from $\pi/2$ to $\pi$. The phase component $RF_2$, on the other hand, is constructed of the negative cosine function from 0 to $\pi/2$ and the negative sine function from $\pi/2$ to $\pi$ with phase shifts of $-2\pi$ to 0 and $-2\pi$ to 0, respectively. As before, it should be noted that while a particular embodiment of the SAIL pulse sequence is illustrated in FIG. 4E, it is specifically contemplated that the term SAIL pulse sequence is intended to encompass all RF pulse sequences which include a waveform component RF, having at least two adjoining generally sinusoidal sections of any type with a phase shift of $\pi/2$ therebetween and a similarly configured phase component $RF_2$.

Figure 4F:
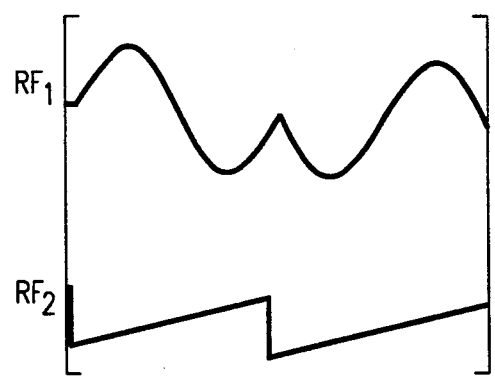
FIG. 4F is a expanded schematic diagram of a sixth embodiment of the multiple shaped radiofrequency pulse sequences RF$_1$, RF$_2$ of FIG. 3A also referred to as the RODEO SHIFT pulse sequence.

Referring next to FIG. 4F, yet another variant of the RODEO pulse sequence, herein referred to as a RODEO SHIFT pulse sequence may now be seen. To form this pulse sequence, the waveform component $RF_1$ and the phase component $RF_2$ of the RODEO pulse sequence are combined to form a composite pulse sequence $RF_1$. The phase component $RF_2$ is then formed using a first linear ramp between zero and $2\pi$ which produces phase shifts in the waveform component $RF_1$ of $-4\pi$ at zero and zero at $2\pi$ and a second linear ramp between $2\pi$ and $4\pi$ which produces a phase shift of $-4\pi$ at $2\pi$ and zero at $4\pi$. Again, it is noted that, while a particular embodiment of the RODEO SHIFT pulse sequence is illustrated in FIG. 4F, it is specifically contemplated that the term RODEO SHIFT pulse sequence is intended to encompass all RF pulse sequences which include a waveform component of a RODEO type pulse sequence $RF_1$, either composite or otherwise, in combination with a linear ramping phase component $RF_2$.

Figure 3B:
FIG. 3B is a schematic diagram of a first magnetic field gradient pulse sequence $G_x$ to be generated along a first axis.
Figure 3C:
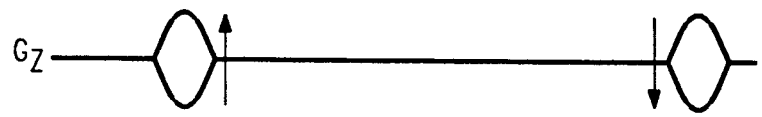
FIG. 3C is a schematic diagram of a second magnetic field gradient pulse sequence $G_z$ to be generated along a second axis.
Figure 3D:
FIG. 3D is a schematic diagram of a third magnetic field gradient pulse sequence $G_y$ to be generated along a third axis.
Figure 5:
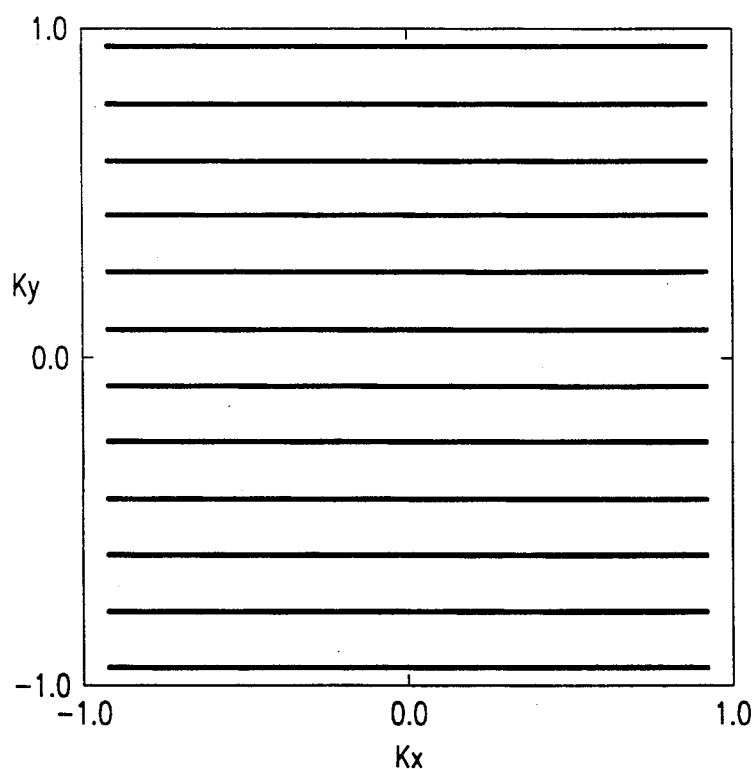
FIG. 5 is a graphical illustration of the k-space sampling of echoes produced by the generation of the magnetic field gradient pulse sequences of FIGS. 3B-D in the presence of transverse magnetization produced by the RF pulse sequence of FIG. 3A.

Referring next to FIG. 5, the k-space sampling of echoes produced by the generation of the magnetic field gradient pulse sequences of FIGS. 3B-D in the presence of transverse magnetization produced by the RF pulse sequence of FIG. 3A may now be seen. Each line of k-space echoes are produced by the stepping of $G_x$ between 1 and M for set values of $RF_1$, $RF_2$, $G_Z$ and $G_Y$. Each time $G_Z$ is stepped between 1 and N, and $G_x$ is stepped between 1 and M for set values of $RF_1$, $RF_2$, and $G_Y$, an additional line of k-space echoes, each acquired when $G_Y$ goes positive are produced.

Referring next to FIGS. 6A-E, certain characteristics of the various pulse sequences described above with respect to FIGS. 4A-F which may be utilized in selecting a pulse sequence to image an object will now be described in greater detail. More specifically, FIGS. 6A-D illustrate plots of transverse magnetization amplitude versus frequency of excitation for the various pulse sequences previously described at length. When imaging tissue containing both fat and water, it is preferred that the transmit frequency is positioned at the resonance frequency for the primary fat signal, i.e., about 64 MHz., such that the signal from water receives maximum excitation while the signal from fat is suppressed. Compared to prior RF pulse sequences, it had been discovered that the RODEO pulse sequence provides a broader null bandwidth for fat frequency and a larger excitation of the water off resonance, thereby increasing the amount of T1 weighting in the final images. Accordingly, it had been previously contemplated that the RODEO pulse sequence is particularly well suited for increasing the amount of signal detected in three dimensional MR images of the brain, extremities, knee and breast, increasing the amount of T1 weighting in fat suppressed three dimensional images of the brain, extremities, knee and breast, increasing the signal from blood when water is off resonance, and suppressing the signal from fat in three dimensional MR images. Further selectivity of a particular pulse sequence from various variants of the RODEO pulse sequence disclosed herein is possible depending on the characteristics of a particular object to be imaged. Accordingly, by reference to FIGS. 6A-E, the comparative ability of the disclosed variants of the RODEO pulse sequence to produce MR images of an object such as tissue having water and fat components by the ability to selectively enhance or suppress the signal from the components of the object will now be described in greater detail.

Figure 6A:
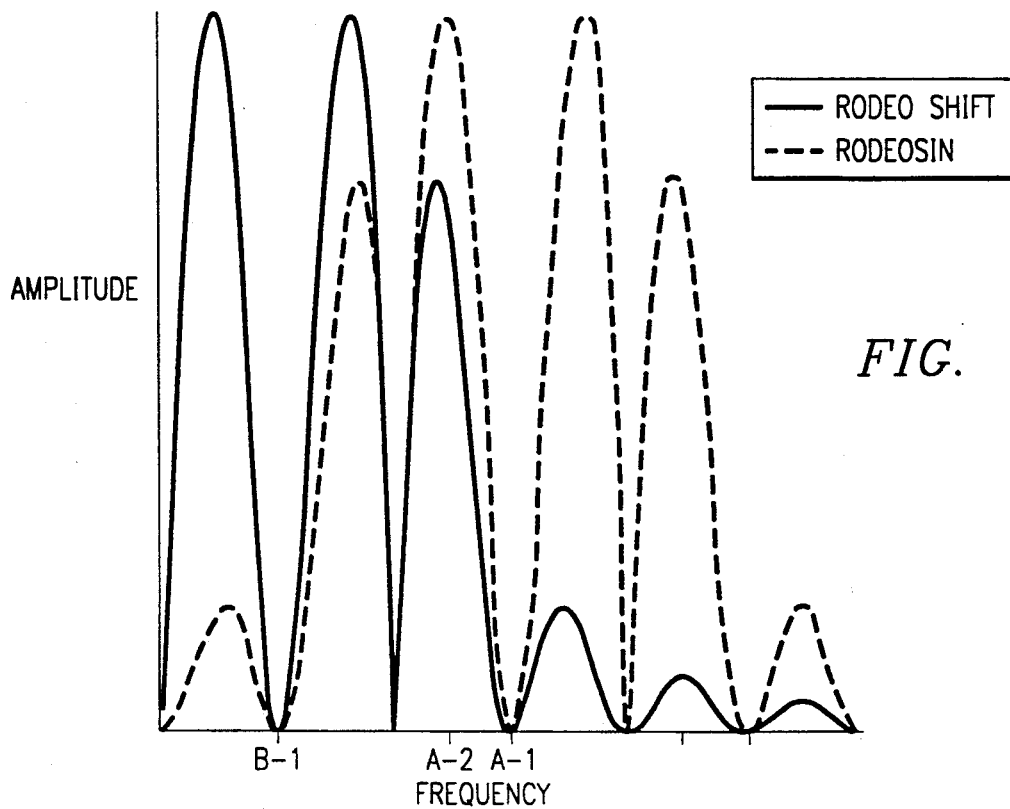
FIG. 6A is a graphical comparison of transverse magnetization produced by the RODEO pulse sequence of FIG. 3A having a selected centering frequency and a shifted RODEO pulse sequence produced either by shifting the selected centering frequency for the RODEO pulse sequence or by modifying RF$_2$ in a manner similar to that illustrated in FIG. 4F.

In FIG. 6A, the transverse magnetization produced within a tissue sample by the RODEOSIN pulse sequence of FIG. 4A is compared to the transverse magnetization produced within the same sample by the RODEO SHIFT pulse sequence. It should be noted that the transverse magnetization generated by the RODEO SHIFT pulse sequence may be produced in two ways. Either by the generation of the RODEO SHIFT pulse sequence illustrated in FIG. 4F or by shifting the centering frequency of the RODEO SIN pulse sequence of FIG. 4A from frequency A-1 to frequency B-1, as illustrated in FIG. 6A. The null of the RODEO pulse sequence is centered at frequency A-1, the resonance frequency of the primary fat signal, which, under most circumstances, resonates at about 64 MHz. Thus, minimal transverse magnetization is generated at the resonance frequency of fat, thereby suppressing imaging of the fat component of the tissue sample. While suppression of the fat component is significant, the relatively narrow null produced at frequency A-1 and the tendency of a portion of f at to resonate off-resonance will still result in the imaging of a portion of the fat component. Water, on the other hand, has a primary resonance frequency A-2. Thus, significant transverse magnetization of the water component is produced, thereby enhancing imaging of the water component of the tissue sample.

Figure 6B:
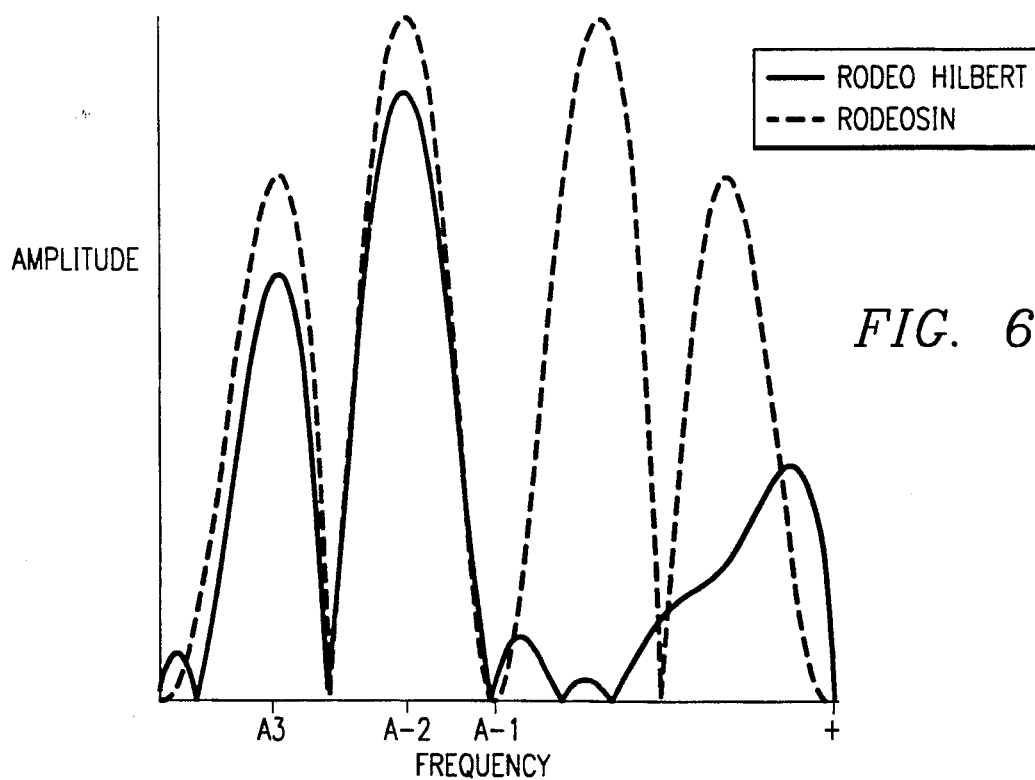
FIG. 6B is a graphical comparison of transverse magnetization produced by the RODEO pulse sequence of FIG. 4A and the RODEO HILBERT pulse sequence of FIG. 4B.
Figure 6C:
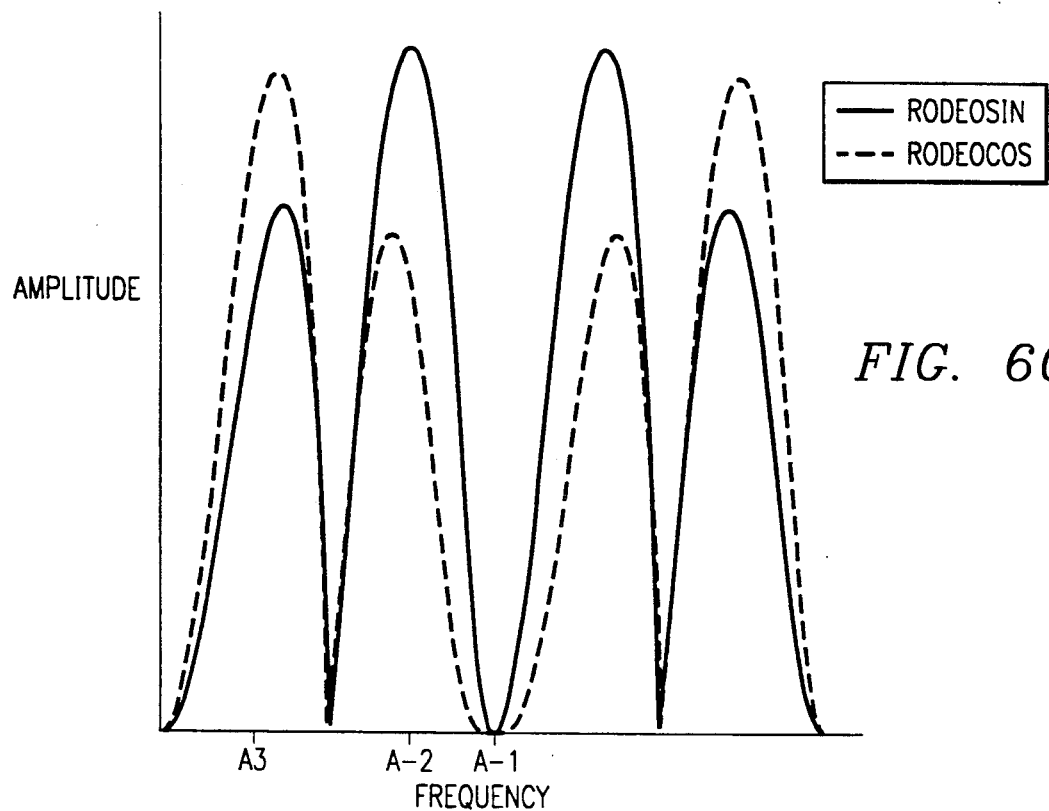
FIG. 6C is a graphical comparison of transverse magnetization produced by the RODEO pulse sequence of FIG. 4A and the RODEOCOS pulse sequence of FIG. 4C.

When the RODEOSIN pulse sequence is shifted leftward, as illustrated in FIG. 6A, fat suppression is enhanced by the broader null now centered at the resonance frequency of fat. A significant amount of the off-resonance fat will also be suppressed by the dramatic reduction in transverse magnetization produced at frequencies above and below the null frequency. The water signal will be somewhat weaker due to the reduction of transverse magnetization at frequency A-2, the resonance frequency for water. However, the improved suppression of fat signal more than compensates for the reduction of the water signal. Referring next to FIG. 6B, the RODEOSIN and RODEO HILBERT pulse sequences are compared. As may now be seen, the use of the RODEO HILBERT pulse sequences, while producing more on-resonance fat signal due to the narrower null at frequency A-1, the resonant frequency for fat, also provides a significant reduction of excitation on one side of the null frequency which reduces the excitation of off-resonance fat. While reduced, the excitation of on-resonance water at frequency A-2 is still strong. Referring next to FIG. 6C, the RODEOSIN and RODEOCOS pulse sequences are compared. As may now be seen, the use of the RODEOCOS pulse sequence produces a significantly wider null at A-1, the resonance frequency of fat, thereby reducing the amount of signal produced by on-resonance fat. Transverse magnetization is also reduced at A-2, the resonance frequency for water, thereby reducing the strength of the water signal. However, the RODEOCOS pulse sequence produces more magnetization transfer contrast (or "MTC") produced by excitation of off-resonance water. The increased MTC signal is evidenced by the increased signal at frequency A-3.

Figure 6D:
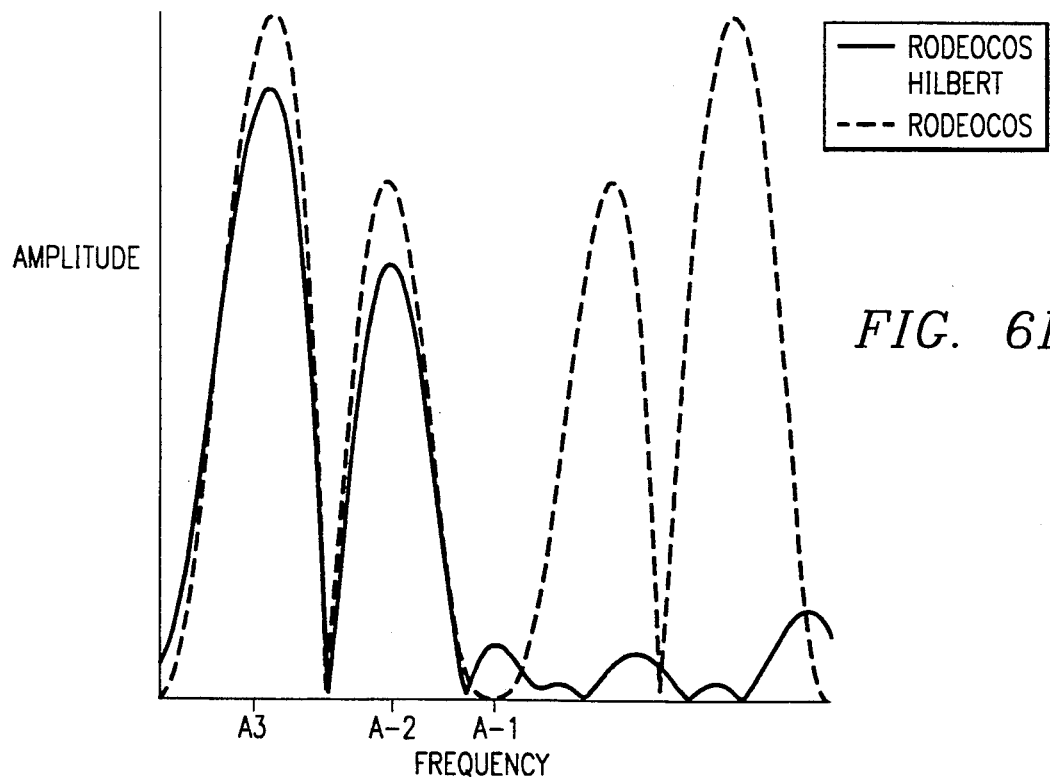
FIG. 6D is a graphical comparison of transverse magnetization produced by the RODEOCOS pulse sequence of FIG. 4C and the RODEOCOS HILBERT pulse sequence of FIG. 4D.

In FIG. 6D, a comparison of the transverse magnetization produced by the RODEOCOS pulse sequence and the RODEOCOS HILBERT pulse sequence may now be seen. The RODEOCOS pulse sequence is characterized by superior suppression of on-resonance fat due to the wider null at A-1, the resonance frequency of fat and excitation of on-resonance and off-resonance water, as evidenced by the higher transverse magnetization signals at both A-2 and A-3. The RODEOCOS HILBERT pulse sequence, on the other hand, is characterized by superior suppression of off-resonance fat, as evidenced by the lower transverse magnetization signal at frequencies on one side of the null frequency A-1.

Figure 6E:
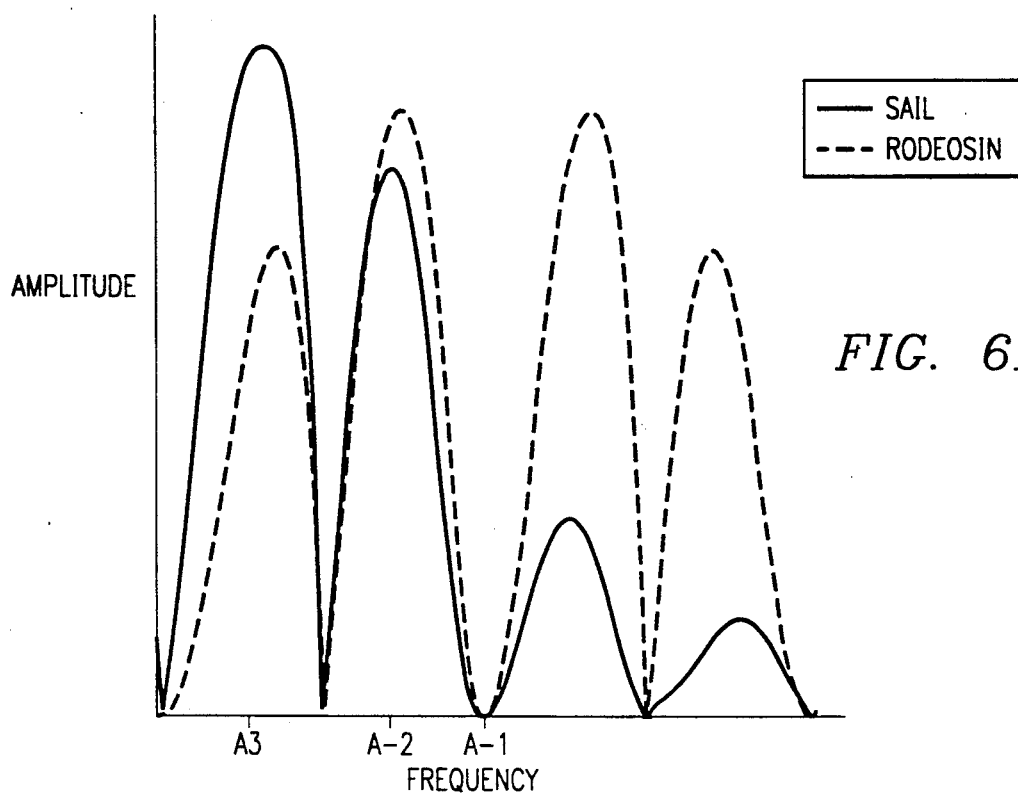
FIG. 6E is a graphical comparison of transverse magnetization produced by the RODEO pulse sequence of FIG. 4A and the SAIL pulse sequence of FIG. 4E.

Referring next to FIG. 6E, a comparison of the transverse magnetization produced by application of the RODEOSIN and SAIL pulse sequences may now be seen. Compared to the RODEOSIN pulse sequence, as evidenced by the broader, asymmetrical excitation null at frequency A-1 and the reduced signal on one side of frequency A-1, the SAIL pulse sequence provides improved suppression of both on and off resonance fat. While the SAIL pulse sequence produces less on-resonance resonance excitation of water at frequency A-2, the greater peak at frequency A-3 indicates improved magnetization transfer contrast due to off-resonance excitation of water.

Figure 7A:
FIGS. 7A-B are schematic diagrams of multiple shaped radiofrequency pulse sequences RF$_1$, RF$_2$ which are generated to produce transverse magnetization within an object to be imaged in accordance with a second embodiment of the magnetic resonance imaging technique of FIG. 2.
Figure 7B:
Figure 7C:
FIGS. 7C-E are schematic diagrams of first, second, and third magnetic field gradient pulse sequences G$_X$, G$_Z$, and G$_Y$ to be generated along the first, second and third axes, respectively, in the presence of the transverse magnetization of the RF pulse sequences of FIGS. 7A-B to produce an echo sequence.
Figure 7D:
Figure 7E:
Figure 8A:
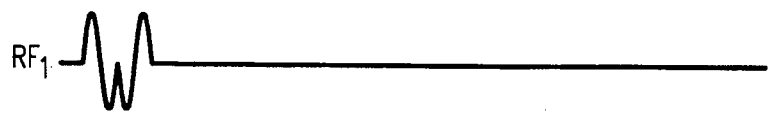
FIGS. 8A-B are schematic diagrams of multiple shaped radiofrequency pulse sequences RF$_1$, RF$_2$ which are generated to produce transverse magnetization within an object to be imaged in accordance with a third embodiment of the magnetic resonance imaging technique of FIG. 2.
Figure 8B:
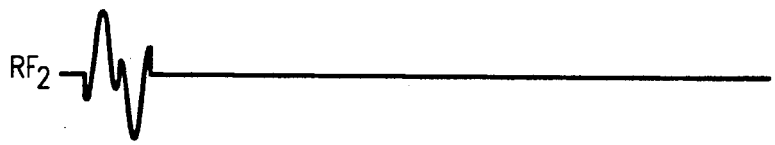
Figure 8C:
FIGS. 8C-E are schematic diagrams of first, second, and third magnetic field gradient pulse sequences G$_x$, G$_z$ and G$_y$ to be generated along the first, second and third axes, respectively, in the presence of the transverse magnetization of the RF pulse sequences of FIGS. 8A-B to produce an echo sequence.
Figure 8D:
Figure 8E:

Referring next to FIGS. 7A-E, another embodiment of selected pulse sequences $RF_1$, $RF_2$, $G_X$, $G_Y$ and $G_Z$ will now be described. As may now be seen in FIGS. 7A-B, the generated RF signal is comprised of a RODEO pulse sequence in which the waveform component of the RF signal is contained in the first pulse sequence $RF_1$ and the phase component of the RF signal is contained in the second pulse sequence $RF_2$. While FIGS. 7A-B illustrate the RODEOSIN pulse sequence, it is specifically contemplated that any of the variants of the RODEO pulse sequence would be suitable for use herein. As before, RF pulse sequences $RF_1$ and $RF_2$ are simultaneously generated to produce transverse magnetization in the object 14 to be imaged. A first magnetic field gradient phase encoding pulse $G_x$ is set at an initial value and then generated along the X axis of the object 14. Most commonly, the initial setting of the first magnetic field gradient phase encoding pulses $G_{x-1}$, would correspond to the application of the $G_x$ pulse full force in a positive direction along the X axis. Magnetic field gradient phase encoding pulses $G_x$ then returns to zero while both first and second magnetic field gradient readout pulse sequences $G_Y$ and $G_Z$ repeatedly alternate between positive and negative amplitude portions to acquire multiple echoes in k-space. Preferably, magnetic field gradient readout pulse sequences $G_Y$ and $G_Z$ are offset relative to each other to maximize the number of echoes acquired during the echo acquisition period. For example, in FIGS. 7D-E, $G_Z$ is defined as $y = ax \sin x$, $0 \leq x \leq n\pi$ and $G_Y$ is defined as $ax \cos x$, $0 \leq x \leq n\pi$ where $n\pi$ is the data acquisition period which, in FIGS. 7D-E is $10\pi$, and a is the amplitude of the gradient, either $G_Z$ or $G_Y$, respectively, along the x-axis where a varies linearly from zero to full gradient amplitude. Echo acquisition continues in k-space until the magnetic field gradient readout pulse sequence $G_Z$ and $G_Y$ return to zero at the end of the data acquisition period and the acquisition of a spiral of k-space echo data is complete. A rewinder gradient of equal magnitude, but in the opposite direction to the phase encoding gradient, are then generated along the $G_x$ axis prior to a next echo acquisition period. If desired, a spoiler pulse (not shown) may be applied along the X axis to spoil the steady state RF generated spin echo before initiation of a next echo acquisition period.

The above-described sequence is then repeated or "played out" a number of times until sufficient echo data has been acquired. In the first iteration, the magnetic field gradient phase encoding pulse $G_{x-1}$ was applied at full strength in a positive direction. In a first series of successive iterations, $G_x$ is varied between M different settings while the prior settings for $RF_1$, $RF_2$, $G_Z$ and $G_Y$ are repeated. For example, if the initial setting $G_{x-1}$ was full strength in the positive direction, in successive settings, the strength of $G_x$ should be gradually lowered until, during phase encoding pulse $G_x$. $(M/2)$, $G_x$ is turned off and during the last phase encoding pulse $G_{x-M}$, $G_x$ is applied full force in a negative direction. Thus, the $RF_1$, $RF_2$ $G_Z$ and $G_Y$ pulse sequences are played out a total of M times. As before, a suitable value for M is 128. In this manner, the total data acquisition time is substantially reduced as the pulse sequence need only be played out 128, rather than 16,384 times. Referring momentarily to FIGS. 8A-E, a variant of the embodiment of the invention disclosed in FIGS. 7A-E may now be seen. Here, the RODEO HILBERT pulse sequence shown in FIG. 4B is selected as the RF signal while $G_x$, $G_Z$ and $G_Y$ are unchanged.

The above-described $RF_1$, $RF_2$, $G_x$, $G_Y$ and $G_Z$ pulse sequences assume that the transmitter and receiver phase are held constant between successive generations of the pulse sequences. In a further embodiment of the invention, it is contemplated that the RF transmitter and receiver phases may be varied between successive generations of the pulse sequences, either the $RF_1$, $RF_2$, $G_x$, $G_Y$ and $G_Z$ described in FIGS. 7A-E or the $RF_1$, $RF_2$, $G_x$, $G_Y$ and $G_Z$ described in FIGS. 8A-E, by selective adjustment of the RF oscillator 34, for example, to randomly step the RF transmitter and receiver between 0° and 360°.

Figure 9:
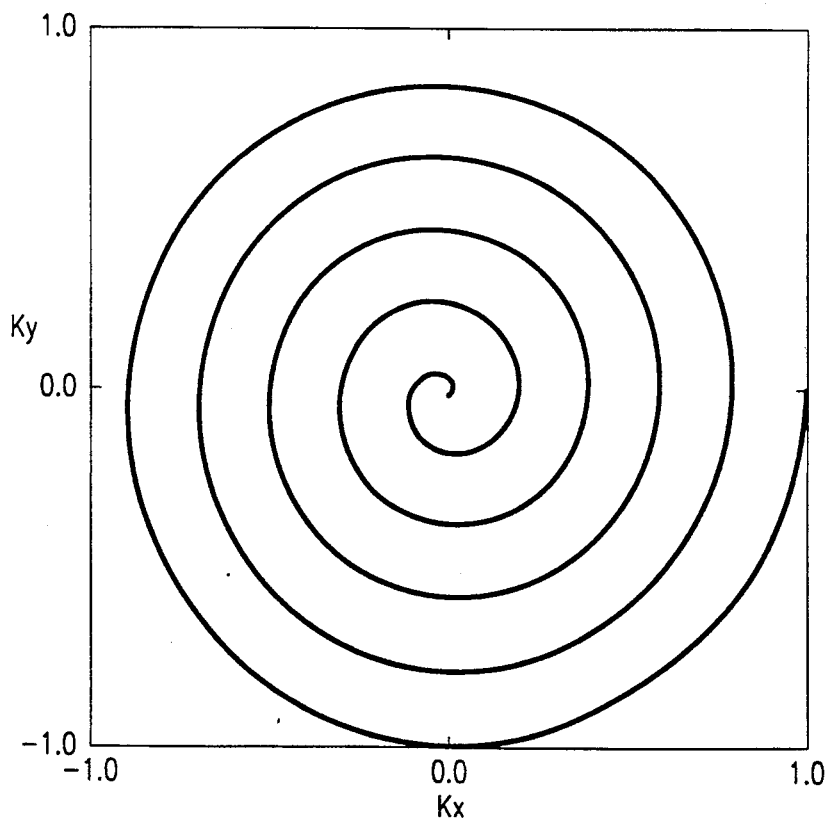
FIG. 9 is a graphical illustration of the k-space sampling of echoes produced by the generation of either the magnetic field gradient pulse sequences of FIGS. 7C-E or FIGS. 8C-E in the presence of transverse magnetization produced by the RF pulse sequence of FIGS. 7A-B or FIGS. 8A-B, respectively.

Referring next to FIG. 9, the k-space sampling of echoes produced by the generation of the magnetic field gradient pulse sequences of FIGS. 7C-E or FIGS. 8C-E in the presence of transverse magnetization produced by either the RF pulse sequence of FIGS. 7A-B or FIGS. 8A-B may now be seen. The illustrated spiral of acquired k-space echoes are produced by the repeated sequential alternation between positive and negative amplitudes for both the first and second magnetic field gradient readout pulse sequences $G_Y$ and $G_Z$ during the data acquisition period for a set value of $G_x$. Additional spirals of data would be acquired for each value of $G_x$ between 1 and M.

Referring next to FIGS. 10A-E, yet another embodiment of selected pulse sequences $RF_1$, $RF_2$, $G_X$, $G_Y$ and $G_Z$ will now be described. As may now be seen in FIGS. 10A-B, the generated RF signal is again comprised of a RODEO pulse sequence such as the RODEOSIN pulse sequence in which the waveform component of the RF signal is contained in the first pulse sequence $RF_1$ and the phase component of the RF signal is contained in the second pulse sequence $RF_2$. As before, RF pulse sequences $RF_1$ and $RF_2$ are simultaneously generated to produce transverse magnetization in the object 14 to be imaged. First and second magnetic field gradient phase encode pulses $G_x$ and $G_z$ (also commonly known as the slice and phase encode pulses, respectively) are set at an initial value and then generated along the X and Z axes of the object 14. Most commonly, the initial setting of the first magnetic field phase encode pulses $G_{x-1}$ and $G_{Z-1}$ would correspond to the application of the $G_x$ and $G_z$ pulses full force in a positive direction along the X and Z axes, respectively. Generated simultaneously with the set values for $G_x$ and $G_Z$ is a magnetic field gradient readout pulse $G_Y$. $G_x$, $G_Y$, and $G_Z$ are all held at a constant value during a data acquisition period which continues until the magnetic field gradient pulse sequences $G_x$, $G_Z$ and $G_Y$ simultaneously return to zero and the acquisition of a projection of k-space echo data is complete.

The above-described sequence is then repeated or "played out" a number of times until sufficient echo data has been acquired. In the first iteration, the magnetic field gradient phase encode pulses $G_{x-1}$, and $G_{z-1}$ were applied at full strength in a positive direction. In the first iteration, the magnetic field gradient phase encoding pulse $G_{z-1}$ was applied at full strength in a positive direction. In a first series of successive iterations, $G_z$ is varied between M different settings while the prior settings for $RF_1$, $RF_2$, $G_x$ and $G_y$ are repeated. For example, if the initial setting $G_{z-1}$ was full strength in the positive direction, in successive settings, the strength of $G_z$ should be gradually lowered until, during phase encoding pulse $G_{z-(m/2)}$, $G_z$ is turned off and during the last phase encoding pulse $G_{z-M}$, $G_z$ is applied full force in a negative direction. $G_z$ is then re-set to its original setting $G_{z-1}$ while $G_x$ is changed to a next setting $G_{X-2}$. In a next series of iterations, $G_z$ is again varied between 1 and M while $G_x$ is held at $G_{x-2}$ and $RF_1$, $RF_2$ and $G_y$ are held at their prior settings, thereby acquiring a next projection of k-space echo data. This sequence is repeated for N values of $G_x$ where $G_{x-1}$, is full strength in the positive direction, $G_{x-(N/2)}$ is turned off and $G_{x-N}$ is full strength in the negative direction. Thus, the $RF_1$, $RF_2$ and $G_y$ pulse sequences are played out a total of MN times. As before, a suitable value for both M and N is 128. Referring momentarily to FIGS. 11A-E, a variant of the embodiment of the invention disclosed in FIGS. 10A-E may now be seen. Here, the RODEO HILBERT pulse sequence shown in FIG. 4B is selected as the RF signal while $G_X$, $G_Z$ and $G_Y$ are unchanged.

The above-described $RF_1$, $RF_2$, $G_x$, $G_Y$ and $G_z$ pulse sequences assume that the transmitter and receiver phase are held constant between successive generations of the pulse sequences. In a further embodiment of the invention, it is contemplated that the RF transmitter and receiver phases may be varied between successive generations of the pulse sequences, either the $RF_1$, $RF_2$, $G_x$, $G_Y$ and $G_Z$ described in FIGS. 10A-E or the $RF_1$, $RF_2$, $G_X$, $G_Y$ and $G_Z$ described in FIGS. 11A-E, by selective adjustment of the RF oscillator 34, for example, to randomly step the RF transmitter and receiver between 0° and 360°.

Figure 10A:
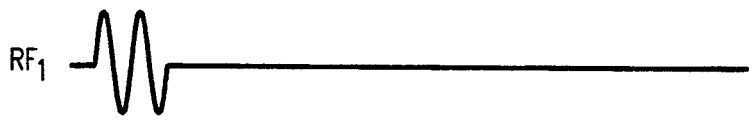
FIGS. 10A-B are schematic diagrams of multiple shaped radiofrequency pulse sequences RF$_1$, RF$_2$ which are generated to produce transverse magnetization within an object to be imaged in accordance with a fourth embodiment of the magnetic resonance imaging technique of FIG. 2.
Figure 10B:
Figure 10C:
FIGS. 10C-E are schematic diagrams of first, second, and third magnetic field gradient pulse sequences G$_X$, G$_Z$ and G$_Y$ to be generated along the first, second and third axes, respectively, in the presence of the transverse magnetization of the RF pulse sequences of FIGS. 10A-B to produce an echo sequence.
Figure 10D:
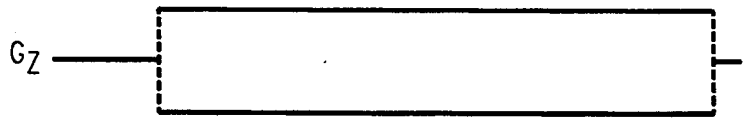
Figure 10E:
Figure 11A:
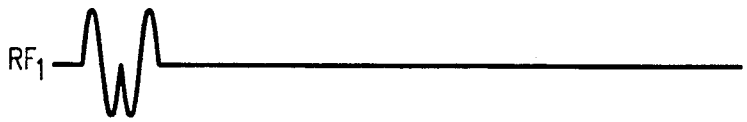
FIGS. 11A-B are schematic diagrams of multiple shaped radiofrequency pulse sequences RF$_1$, RF$_2$ which are generated to produce transverse magnetization within an object to be imaged in accordance with a fifth embodiment of the magnetic resonance imaging technique of FIG. 2.
Figure 11B:
Figure 11C:
FIGS. 11C-E are schematic diagrams of first, second, and third magnetic field gradient pulse sequences G$_X$, G$_Z$ and G$_Y$ to be generated along the first, second and third axes, respectively, in the presence of the transverse magnetization of the RF pulse sequences of FIGS. 11A-B to produce an echo sequence.
Figure 11D:
Figure 11E:
Figure 12:
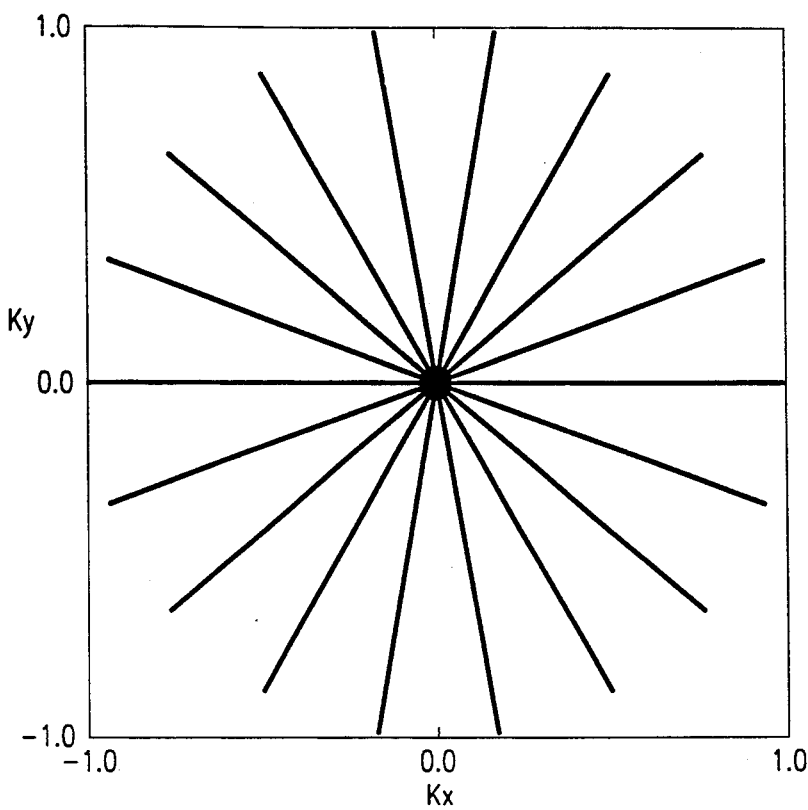
FIG. 12 is a graphical illustration of the k-space sampling of echoes produced by the generation of the magnetic field gradient pulse sequences of either FIGS. 10C-E or FIGS. 11C-E in the presence of transverse magnetization produced by the RF pulse sequence of FIGS. 10A-B or FIGS. 11A-B, respectively.

Referring next to FIG. 12, the k-space sampling of echoes produced by the generation of the magnetic field gradient pulse sequences of FIGS. 10C-E or FIGS. 11C-E in the presence of transverse magnetization produced by either the RF pulse sequence of FIGS. 10A-B or FIGS. 10A-B may now be seen. The illustrated star-shaped projection of acquired k-space echoes are produced by playing out $G_z$ M times for fixed values of $G_x$ and $G_Y$. Additional projections of data would be acquired for each value of $G_z$ played out between 1 and N. The acquired projection of k-space echoes is symmetrical around any one of the lines illustrated in FIG. 12. Accordingly, to produce the full series of echoes, the pulse sequence need be played out only half of the number of times previously stated.

Referring next to FIGS. 13A-E, still yet another embodiment of selected pulse sequences $RF_1$, $RF_2$, $G_X$, $G_Y$ and $G_Z$ will now be described. As may now be seen in FIGS. 13A-B, the generated RF signal is again comprised of a RODEO pulse sequence, for example, the RODEOSIN pulse sequence, in which the waveform component of the RF signal is contained in the first pulse sequence $RF_1$ and the phase component of the RF signal is contained in the second pulse sequence $RF_2$. As before, RF pulse sequences $RF_1$ and $RF_2$ are simultaneously generated to produce transverse magnetization in the object 14 to be imaged. A first magnetic field gradient phase encoding pulse $G_x$ (also commonly known as the slice encoding gradient) is set at an initial value and then generated along the X axis of the object 14. Most commonly, the initial setting of the first magnetic field gradient phase encoding pulses $G_{x-1}$ would correspond to the application of the $G_x$ pulse full force in a positive direction along the X axis. Magnetic field gradient phase encoding pulses $G_x$ then returns to zero while both magnetic field gradient phase encode pulse sequence $G_z$ (commonly known as the phase encode pulse sequence) and magnetic field gradient readout pulse sequences $G_Y$ and $G_Z$ are played out to acquire multiple echoes in k-space. $G_y$ alternates between positive and negative segments and, in one specific embodiment thereof, $G_y$ is configured as a square wave having equal positive and negative amplitudes. $G_z$, on the other hand, is a positive amplitude spike generated at each zero crossing for $G_Y$. Echo acquisition continues in k-space until the magnetic field gradient readout pulse sequence $G_Y$ return to zero at the end of the data acquisition period and the acquisition of a plane of k-space echo data is complete. A rewinder gradients of equal magnitude, but in the opposite direction to the phase encoding gradient, are then generated along the $G_x$ axis prior to a next echo acquisition period. If desired, a spoiler pulse (not shown) may be applied along the X axis to spoil the steady state RF generated spin echo before initiation of a next echo acquisition period.

The above-described sequence is then repeated or "played out" a number of times until sufficient echo data has been acquired. In the first iteration, the magnetic field gradient phase encoding pulse $G_{x-1}$ was applied at full strength in a positive direction. In a first series of successive iterations, $G_x$ is varied between M different settings while the prior settings for $RF_1$, $RF_2$, $G_Z$ and $G_Y$ are repeated. For example, if the initial setting $G_{X-1}$ was full strength in the positive direction, in successive settings, the strength of $G_X$ should be gradually lowered until, during phase encoding pulse $G_{x-(M/2)}$, $G_X$ is turned off and during the last phase encoding pulse $G_{X-M}$, $G_X$ is applied full force in a negative direction. Thus, the $RF_1$, $RF_2$ $G_Z$ and $G_Y$ pulse sequences are played out a total of M times. As before, a suitable value for M is 128. In this manner, the total data acquisition time is substantially reduced as the pulse sequence need only be played out 128, rather than 16,384 times. Referring momentarily to FIGS. 14A-E, a variant of the embodiment of the invention disclosed in FIGS. 13A-E may now be seen. Here, the RODEO HILBERT pulse sequence shown in FIG. 4B is selected as the RF signal while $G_X$, $G_Z$ and $G_Y$ are unchanged.

The above-described $RF_1$, $RF_2$, $G_X$, $G_Y$ and $G_Z$ pulse sequences assume that the transmitter and receiver phase are held constant between successive generations of the pulse sequences. In a further embodiment of the invention, it is contemplated that the RF transmitter and receiver phases may be varied between successive generations of the pulse sequences, either the $RF_1$, $RF_2$, $G_X$, $G_Y$ and $G_Z$ described in FIGS. 13A-E or the $RF_1$, $RF_2$, $G_X$, $G_Y$ and $G_Z$ described in FIGS. 14A-E, by selective adjustment of the RF oscillator 34, for example, to randomly step the RF transmitter and receiver between 0° and 360°.

Figure 13A:
FIGS. 13A-B are schematic diagrams of multiple shaped radiofrequency pulse sequences RF$_1$, RF$_2$ which are generated to produce transverse magnetization within an object to be imaged in accordance with a sixth embodiment of the magnetic resonance imaging technique of FIG. 2.
Figure 13B:
Figure 13C:
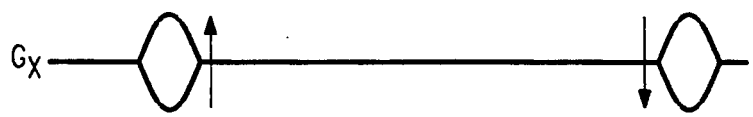
FIGS. 13C-E are schematic diagrams of first, second, and third magnetic field gradient pulse sequences G$_X$, G$_Z$ and G$_Y$ to be generated along the first, second and third axes, respectively, in the presence of the transverse magnetization of the RF pulse sequences of FIGS. 13A-B to produce an echo sequence.
Figure 13D:
Figure 13E:
Figure 14A:
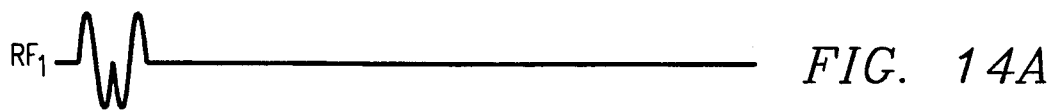
FIGS. 14A-B are schematic diagrams of multiple shaped radiofrequency pulse sequences RF$_1$, RF$_2$ which are generated to produce transverse magnetization within an object to be imaged in accordance with a seventh embodiment of the magnetic resonance imaging technique of FIG. 2.
Figure 14B:
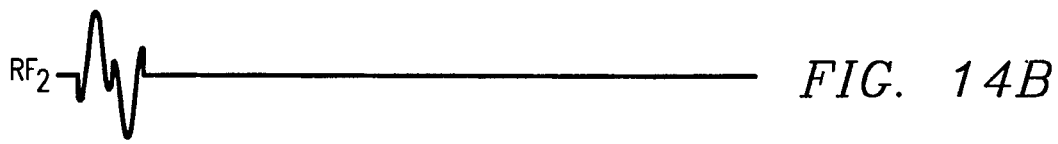
Figure 14C:
FIGS. 14C-E are schematic diagrams of first, second, and third magnetic field gradient pulse sequences G$_X$, G$_Z$ and G$_Y$ to be generated along the first, second and third axes, respectively, in the presence of the transverse magnetization of the RF pulse sequences of FIGS. 14A-B to produce an echo sequence.
Figure 14D:
Figure 14E:
Figure 15:
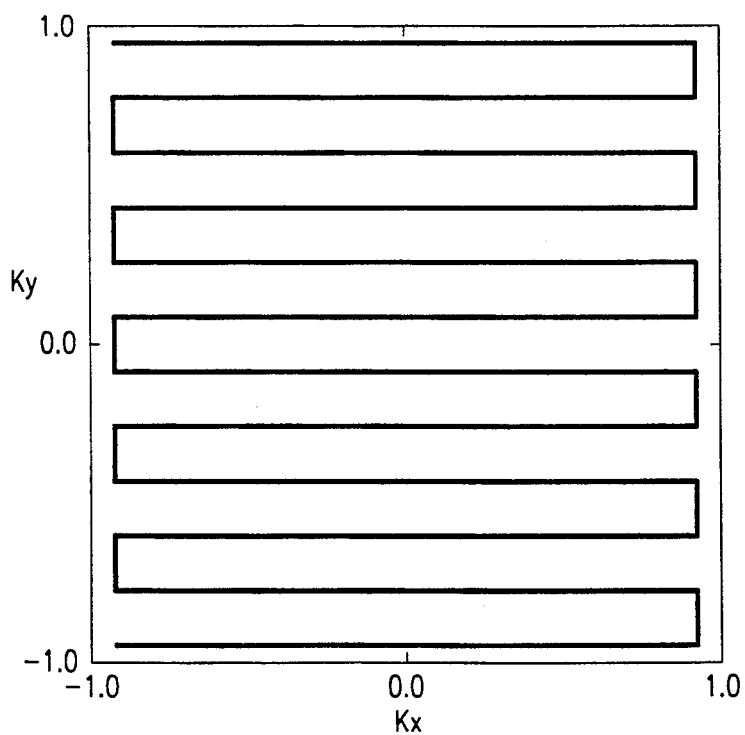
FIG. 15 is a graphical illustration of the k-space sampling of echoes produced by the generation of the magnetic field gradient pulse sequences of either FIGS. 13C-E or FIGS. 14C-E in the presence of transverse magnetization produced by the RF pulse sequence of FIGS. 13A-B or FIGS. 14A-B, respectively.

Referring next to FIG. 15, the k-space sampling of echoes produced by the generation of the magnetic field gradient pulse sequences of FIGS. 13C-E or FIGS. 14C-E in the presence of transverse magnetization produced by either the RF pulse sequence of FIGS. 13A-B or FIGS. 13A-B may now be seen. The illustrated plane of acquired k-space echoes includes a series of positive-going lines acquired while $G_Y$ is positive, a series of negative-going lines acquired while $G_Y$ is negative and vertical lines acquired during the positive amplitude $G_Z$ spikes.

Thus, there has been described and illustrated herein, an apparatus and method for producing an image of the interior of an object using magnetic resonance imaging techniques in which selected components of the object may either be suppressed and/or enhanced and the time required to acquire sufficient data to produce a selective component suppressed/enhanced three-dimensional MR image of the interior of the object be reduced by selection of particular radiofrequency and/or magnetic field gradient pulse sequences to be generated during the data acquisition process. However, those skilled in the art will recognize that many modifications and variations besides those specifically mentioned may be made in the techniques described herein without departing substantially form the concept of the present invention. Accordingly, it should be clearly understood that the form of the invention described herein is exemplary only and is not intended as a limitation on the scope of the invention.

What is claimed is:

1. A method of producing an image of an object, comprising the steps of:
    selecting first and second pulse sequences for waveform and phase components of an RF signal, said first pulse sequence being a sinusoidal function and said second pulse sequence being a step function;
    generating said RF waveform and RF phase components of said RF signal, said generated RF signal producing transverse magnetization in said object;
    receiving, in response to the repeated generation of said RF signal in the presence of first, second and third changing magnetic fields, a series of echoes; and
    producing an image of said object from said received series of echoes.

2. A method of producing an image of an object according to claim 1 and further comprising the step of randomly varying transmitter and receiver phases between successive generations of said repeated pulse sequences.

3. A method of producing an image of an object according to claim 1 wherein the step of selecting first and second pulse sequences for waveform and phase components of an RF signal further comprises the steps of:
    selecting said first pulse sequence as defined by the equation $y = \sin x$, $0 \leq x \leq 4\pi$; and
    selecting said second pulse sequence as defined by the equation $y=0$, $0 \leq x \leq 2\pi$, $y=\pi$, $2\pi \leq x \leq 4\pi$.

4. A method of producing an image of an object according to claim 1 wherein the step of selecting first and second pulse sequences for waveform and phase components of an RF signal further comprises the steps of:
    selecting said first pulse sequence as defined by the equation $y = \cos x$, $0 \leq x \leq 4\pi$; and
    selecting said second pulse sequence as defined by the equation $y=0$, $0 \leq x \leq 2\pi$, $y=\pi$, $2\pi \leq x \leq 4\pi$.

5. A method of producing an image of an object, comprising the steps of:
    selecting first and second pulse sequences for waveform and phase components of an RF signal, said first and second pulse sequences each comprised of adjoining first and second generally sinusoidal sections separated from each other by a phase shift of $\pi/2$;
    generating said first and second RF components of said RF signal, said generated RF signal producing transverse magnetization in said object;
    receiving, in response to the repeated generation of said RF signal in the presence of first, second and third changing magnetic fields, a series of echoes; and
    producing an image of said object from said received series of echoes.

6. A method of producing an image of an object according to claim 5 and further comprising the step of randomly varying transmitter and receiver phases between successive generations of said repeated pulse sequences.

7. A method of producing an image of an object according to claim 5 wherein the step of selecting first and second pulse sequences for waveform and phase components of an RF signal further comprises the steps of:
    selecting said first pulse sequence as defined by the equation $y=\sin x$, $0 \leq x \leq \pi/2$, $y=\cos x$, $\pi/2 \leq x \leq \pi$; and
    selecting said second pulse sequence as defined by the equation $y=-2\pi\cos x$, $0 \leq x \leq \pi/2$, $y=-2\pi\sin x$, $\pi/2 \leq x \leq \pi$.

8. A method of producing an image of an object, comprising the steps of:
    selecting first and second pulse sequences for waveform and phase components of an RF signal;
    combining said pulse sequences for said waveform and phase components of said RF signal into a composite RF pulse sequence;
    determining the Hilbert transform of said composite RF pulse sequence;
    generating first and second RF signals, said first signal having said composite RF pulse sequence and said second signal having the Hilbert transform of said composite RF pulse sequence, said first and second generated RF signals producing transverse magnetization in said object;
    receiving, in response to the repeated generation of said RF signal in the presence of first, second and third changing magnetic fields, a series of echoes; and
    producing an image of said object from said received series of echoes.

9. A method of producing an image of an object according to claim 8 and further comprising the step of randomly varying transmitter and receiver phases between successive generations of said repeated pulse sequences.

10. A method of producing an image of an object according to claim 8 wherein the step of selecting first and second pulse sequences for waveform and phase components of an RF signal further comprises the steps of:
    selecting said first pulse sequence as defined by the equation $y=\sin x$, $0 \leq x \leq 4\pi$; and
    selecting said second pulse sequence as defined by the equation $y=0$, $0 \leq x \leq 2\pi$, $y=\pi$, $2\pi \leq x \leq 4\pi$; wherein
    said composite pulse sequence is defined by the equation $y=\sin x$, $0 \leq x \leq 2\pi$, $y=\sin(x+\pi)$, $2\pi \leq x \leq 4\pi$).

11. A method of producing an image of an object according to claim 8 wherein the step of selecting first and second pulse sequences for waveform and phase components of an RF signal further comprises the steps of:
  selecting said first pulse sequence as defined by the equation $y = \cos x$, $0 \leq x \leq 4\pi$; and
  selecting said second pulse sequence as defined by the equation $y = 0$, $0 \leq x \leq 2\pi$, $y = \pi$, $2\pi x \leq 4\pi$; wherein
  said composite pulse sequence is defined by the equation $y = \cos x$, $0 \leq x \leq 2\pi$, $y = \cos(x + \pi)$, $2\pi \leq x \leq 4\pi$).

12. A method of producing an image of an object, comprising the steps of:
  selecting a pulse sequence for an RF signal;
  selecting a centering frequency for said selected RF pulse sequence based upon characteristics of said object to be imaged;
  generating said RF signal having said selected pulse sequence centered at said centering frequency to produce transverse magnetization in said object such that excitation of components of said object by said produced transverse magnetization is controlled by said selected pulse sequence and said centering frequency;
  receiving, in response to the repeated generation of said RF signal in the presence of first, second and third changing magnetic fields, a series of echoes; and
  producing an image of said object from said received series of echoes.

13. A method of producing an image of an object according to claim 12 and further comprising the step of randomly varying transmitter and receiver phases between successive generations of said repeated pulse sequences.

14. A method of producing an image of an object according to claim 12 and further comprising the step of shifting said centering frequency relative to said selected centering frequency and wherein the step of generating said RF signal having said selected pulse sequence further comprises the step of generating said RF signal having said selected pulse sequence centered at said shifted centering frequency, thereby modifying excitation of said components of said object by said produced transverse magnetization.

15. A method of producing an image of an object according to claim 14 wherein the step of selecting a pulse sequence for an RF signal further comprises the step of selecting first and second pulse sequences for waveform and phase components of said RF signal, said first pulse sequence being a sinusoidal function and said second pulse sequence being a step function.

16. A method of producing an image of an object according to claim 15 wherein the step of selecting first and second pulse sequences for waveform and phase components of an RF signal further comprises the steps of:
  selecting said first pulse sequence as defined by the equation $y = \sin x$, $0 \leq x \leq 4\pi$; and
  selecting said second pulse sequence as defined by the equation $y = 0$, $0 \leq x \leq 2\pi$, $y = \pi$, $2\pi \leq x \leq 4\pi$.

17. A method of producing an image of an object according to claim 15 wherein the step of selecting first and second pulse sequences for waveform and phase components of an RF signal further comprises the steps of:
  selecting said first pulse sequence as defined by the equation $y = \cos x$, $0 \leq x \leq 4\pi$; and
  selecting said second pulse sequence as defined by the equation $y = 0$, $0 \leq x \leq 2\pi$, $y = \pi$, $2\pi \leq x \leq 4\pi$.

18. A method of producing an image of an object according to claim 15 wherein the step of selecting first and second pulse sequences for waveform and phase components of an RF signal further comprises the steps of:
  selecting said first pulse sequence as defined by the equation $y = \sin x$, $0 \leq x \leq \pi/2$, $y = \cos x$, $\pi/2 \leq x \leq \pi$; and
  selecting said second pulse sequence as defined by the equation $y = -2\pi\cos x$, $0 \leq x \leq \pi/2$, $y = -2\pi\sin x$, $\pi/2 \leq x \leq \pi$.

19. A method of producing an image of an object according to claim 14 wherein the step of selecting a pulse sequence for an RF signal further comprises the step of:
  selecting first and second pulse sequences for waveform and phase components of an RF signal;
  combining said pulse sequences for said waveform and phase components of said RF signal into a composite RF pulse sequence;
  determining the Hilbert transform of said composite RF pulse sequence;
  wherein the step of generating said RF signal having said selected pulse sequence centered at said shifted centering frequency further comprises the step of generating first and second RF signals at said shifted centering frequency, said first signal having said composite RF pulse sequence and said second signal having the Hilbert transform of said composite RF pulse sequence.

20. A method of producing an image of an object according to claim 19 wherein the step of selecting first and second pulse sequences for waveform and phase components of an RF signal further comprises the steps of:
  selecting said first pulse sequence as defined by the equation $y = \sin x$, $0 \leq x \leq 4\pi$; and
  selecting said second pulse sequence as defined by the equation $y = 0$, $0 \leq x \leq 2\pi$, $y = \pi$, $2\pi \leq x \leq 4\pi$; wherein
  said composite pulse sequence is defined by the equation $y = \sin x$, $0 \leq x \leq 2\pi$, $y = \sin(x + \pi)$, $2\pi \leq x \leq 4\pi$).

21. A method of producing an image of an object according to claim 19 wherein the step of selecting first and second pulse sequences for waveform and phase components of an RF signal further comprises the steps of:
  selecting said first pulse sequence as defined by the equation $y = \cos x$, $0 \leq x \leq 4\pi$; and
  selecting said second pulse sequence as defined by the equation $y = 0$, $0 \leq x \leq 2\pi$, $y = \pi$, $2\pi \leq x \leq 4\pi$; wherein
  said composite pulse sequence is defined by the equation $y = \cos x$, $0 \leq x \leq 2\pi$, $y = \cos(x + \pi)$, $2\pi \leq x \leq 4\pi$).

22. A method of producing an image of an object, comprising the steps of:
  selecting first and second pulse sequences for waveform and phase components of an RF signal;
  combining said pulse sequences for said waveform and phase components of said RF signal into a composite RF pulse sequence;
  selecting a second pulse sequence, said second pulse sequence comprised of first and second linear ramping phase components;
  generating first and second RF signals, said first signal having said composite RF pulse sequence and said second signal having said second pulse sequence, said first and second generated RF signals producing transverse magnetization in said object;

receiving, in response to the repeated generation of said RF signal in the presence of first, second and third changing magnetic fields, a series of echoes; and producing an image of said object from said received series of echoes.

23. A method of producing an image of an object according to claim 22 and further comprising the step of randomly varying transmitter and receiver phases between successive generations of said repeated pulse sequences.

24. A method according to claim 22 wherein the step of selecting a second pulse sequence comprised of first and second linear ramping phase components further comprises the steps of:

selecting said first linear ramp as defined by a linear ramp between zero and $2\pi$ which produces a phase shift in said first pulse sequence of $-4\pi$ at zero and zero at $2\pi$; and selecting said second linear ramp as defined by a linear ramp between $2\pi$ and $4\pi$ which produces a phase shift of $-4\pi$ at $2\pi$ and zero at $4\pi$.

25. A method of producing an image of an object, comprising the steps of:

selecting first and second pulse sequences for waveform and phase components of an RF signal;

selecting first and second gradient magnetic field readout pulse sequences to be generated along first and second axes, respectively, of said object;

generating said RF waveform and RF phase pulse sequences to produce transverse magnetization in said object;

generating said first and second gradient magnetic field readout pulse sequences along said first and second axes and a phase encoding gradient magnetic field along a third axis of said object to produce a first spiral of k-space echoes;

repeatedly stepping said phase encoding gradient magnetic field and generating said RF waveform, RF phase and said first and second gradient magnetic field pulse sequences and said stepped phase encoding gradient magnetic field to produce additional spirals of k-space echoes; and producing an image of said object from said received echoes.

26. A method of producing an image of an object according to claim 25 and further comprising the step of randomly varying transmitter and receiver phases between successive generations of said repeated pulse sequences.

27. A method of producing an image of an object according to claim 25 wherein said RF waveform pulse sequence is a sinusoidal function and said RF phase pulse sequence is a step function.

28. A method of producing an image of an object according to claim 25 wherein the step of selecting first and second pulse sequences for waveform and phase components of an RF signal further comprises the steps of:

selecting said first pulse sequence as defined by the equation $y=\sin x$, $0 \leq x \leq 4\pi$; and selecting said second pulse sequence as defined by the equation $y=0$, $0 \leq x \leq 2\pi$, $y=1$, $2\pi \leq x \leq 4\pi$.

29. A method of producing an image of an object according to claim 25 wherein said first and second gradient magnetic field pulse sequences are sinusoidal functions.

30. A method of producing an image of an object according to claim 29 wherein said first gradient magnetic field pulse sequence is defined by $y=ax \sin x$, $0 \leq x \leq n\pi$ and said second gradient magnetic field pulse sequence is defined by $y=ax \cos x$, $0 \leq x \leq n\pi$.

31. A method of producing an image of an object according to claim 30 wherein said RF waveform pulse sequence is a sinusoidal function and said RF phase pulse sequence is a step function.

32. A method of producing an image of an object according to claim 31 wherein the step of selecting first and second pulse sequences for waveform and phase components of an RF signal further comprises the steps of:

selecting said first pulse sequence as defined by the equation $y=\sin x$, $0 \leq x \leq 4\pi$; and selecting said second pulse sequence as defined by the equation $y=0$, $0 \leq x \leq 2\pi$, $y=\pi$, $2\pi \leq x \leq 4\pi$.

33. A method of producing an image of an object, comprising the steps of:

selecting first and second pulse sequences for waveform and phase components of an RF signal;

combining said pulse sequences for said waveform and phase components of said RF signal into a composite RF pulse sequence;

determining the Hilbert transform of said composite RF pulse sequence;

selecting first and second gradient magnetic field readout pulse sequences to be generated along first and second axes, respectively, of said object;

generating first and second RF signals, said first signal having said composite RF pulse sequence and said second signal having the Hilbert transform of said composite RF pulse sequence, said first and second generated RF signals producing transverse magnetization in said object;

generating said first and second gradient magnetic field readout pulse sequences along said first and second axes and a phase encoding gradient magnetic field along a third axis of said object to produce a first spiral of k-space echoes;

repeatedly stepping said phase encoding gradient magnetic field and generating said first and second RF signals, said first and second gradient magnetic field pulse sequences and said stepped phase encoding gradient magnetic field to produce additional spirals of k-space echoes; and producing an image of said object from said received echoes.

34. A method of producing an image of an object according to claim 33 and further comprising the step of randomly varying transmitter and receiver phases between successive generations of said repeated pulse sequences.

35. A method of producing an image of an object according to claim 33 wherein said RF waveform pulse sequence is a sinusoidal function and said RF phase pulse sequence is a step function.

36. A method of producing an image of an object according to claim 33 wherein the step of selecting first and second pulse sequences for waveform and phase components of an RF signal further comprises the steps of:

selecting said first pulse sequence as defined by the equation $y=\sin x$, $0 \leq x \leq 4\pi$; and selecting said second pulse sequence as defined by the equation y=0, 0≦x≦2π, y=π, 2π≦x≦4π.

37. A method of producing an image of an object according to claim 36 wherein said first and second gradient magnetic field pulse sequences are sinusoidal functions.

38. A method of producing an image of an object according to claim 37 wherein said first gradient magnetic field pulse sequence is defined by y=ax sin x, 0≦x≦nπ and said second gradient magnetic field pulse sequence is defined by y=ax cos x, 0≦x≦n nπ.

39. A method of producing an image of an object according to claim 38 wherein said RF waveform pulse sequence is a sinusoidal function and said RF phase pulse sequence is a step function.

40. A method of producing an image of an object according to claim 39 wherein the step of selecting first and second pulse sequences for waveform and phase components of an RF signal further comprises the steps of:
selecting said first pulse sequence as defined by the equation y=sin x, 0≦x≦4π; and
selecting said second pulse sequence as defined by the equation y=0, 0≦x≦2π, y=π, 2π≦x≦4π.

41. A method of producing an image of an object, comprising the steps of:
selecting first and second pulse sequences for waveform and phase components of an RF signal;
selecting first and second pulse magnitudes for first and second constant magnitude gradient magnetic fields to be generated along first and second axes, respectively, of said object;
generating said RF waveform and RF phase pulse sequences to produce transverse magnetization in said object;
generating said first and second gradient magnetic fields along said first and second axes in the presence of a third, constant magnitude, gradient magnetic field generated along a third axis of said object to produce a first linear projection of k-space echoes;
repeatedly stepping said first and second pulse magnitudes for said first and second gradient magnetic fields and generating said RF waveform and RF phase pulse sequences and said stepped first and second gradient magnetic fields and said third, constant magnitude,, gradient magnetic field to produce additional linear projections of k-space echoes; and
producing an image of said object from said received echoes.

42. A method of producing an image of an object according to claim 41 and further comprising the step of randomly varying transmitter and receiver phases between successive generations of said repeated pulse sequences.

43. A method of producing an image of an object according to claim 41 wherein said RF waveform pulse sequence is a sinusoidal function and said RF phase pulse sequence is a step function.

44. A method of producing an image of an object according to claim 41 wherein the step of selecting first and second pulse sequences for waveform and phase components of an RF signal further comprises the steps of:
selecting said first pulse sequence as defined by the equation y=sin x, 0≦x≦4π; and selecting said second pulse sequence as defined by the equation y=0, 0≦x≦2π, y=π, 2π≦x≦4π.

45. A method of producing an image of an object, comprising the steps of:
selecting first and second pulse sequences for waveform and phase components of an RF signal;
combining said pulse sequences for said waveform and phase components of said RF signal into a composite RF pulse sequence;
determining the Hilbert transform of said composite RF pulse sequence;
selecting first and second pulse magnitudes for first and second constant magnitude gradient magnetic fields to be generated along first and second axes, respectively, of said object;
generating first and second RF signals, said first signal having said composite RF pulse sequence and said second signal having the Hilbert transform of said composite RF pulse sequence, said first and second generated RF signals producing transverse magnetization in said object;
generating said first and second gradient magnetic fields along said first and second axes in the presence of a third, constant magnitude, gradient magnetic field generated along a third axis of said object to produce a first linear projection of k-space echoes;
repeatedly stepping said first and second pulse magnitudes for said first and second gradient magnetic fields and generating said first and second RF pulse sequences and said stepped first and second gradient magnetic fields and said third, constant magnitude, gradient magnetic field to produce additional linear projections of k-space echoes; and
producing an image of said object from said received echoes.

46. A method of producing an image of an object according to claim 45 and further comprising the step of randomly varying transmitter and receiver phases between successive generations of said repeated pulse sequences.

47. A method of producing an image of an object according to claim 45 wherein said RF waveform pulse sequence is a sinusoidal function and said RF phase pulse sequence is a step function.

48. A method of producing an image of an object according to claim 45 wherein the step of selecting first and second pulse sequences for waveform and phase components of an RF signal further comprises the steps of:
selecting said first pulse sequence as defined by the equation y=sin x, 0≦x≦4π; and
selecting said second pulse sequence as defined by the equation y=0, 0≦x≦2π, y=π, 2π≦x≦4π.

49. A method of producing an image of an object, comprising the steps of:
selecting first and second pulse sequences for waveform and phase components of an RF signal;
selecting a gradient magnetic field phase encoding pulse sequence and a gradient magnetic field readout pulse sequence to be generated along first and second axes, respectively, of said object;
generating said RF waveform and RF phase pulse sequences to produce transverse magnetization in said object;
generating said first and second gradient magnetic field readout pulse sequences along said first and second axes and a phase encoding gradient magnetic field along a third axis of said object to produce a first plane of k-space echoes;

said gradient magnetic field phase readout pulse sequence comprised of a series of pulse segments alternately having positive and negative amplitudes and said gradient magnetic field phase encoding pulse sequence comprised of a positive amplitude spike positioned at each transition between positive and negative amplitude pulse segments for said first gradient magnetic field pulse sequence;

repeatedly stepping said phase encoding gradient magnetic field and generating said RF waveform and RF phase pulse sequences, said gradient magnetic field phase encoding and said gradient magnetic field readout pulse sequences and said stepped phase encoding gradient magnetic field to produce additional planes of k-space echoes; and producing an image of said object from said received echoes.

50. A method of producing an image of an object according to claim 49 and further comprising the step of randomly varying transmitter and receiver phases between successive generations of said repeated pulse sequences.

51. A method of producing an image of an object according to claim 49 wherein said gradient magnetic field readout pulse sequence is a square wave having equal positive and negative amplitudes.

52. A method of producing an image of an object according to claim 49 wherein said RF waveform pulse sequence is a sinusoidal function and said RF phase pulse sequence is a step function.

53. A method of producing an image of an object according to claim 49 wherein the step of selecting first and second pulse sequences for waveform and phase components of an RF signal further comprises the steps of:

selecting said first pulse sequence as defined by the equation $y = \sin x$, $0 \leq x \leq 4\pi$; and selecting said second pulse sequence as defined by the equation $y = 0$, $0 \leq x \leq 2\pi$, $y = \pi$, $2\pi \leq x \leq 4\pi$.

54. A method of producing an image of an object, comprising the steps of:

selecting first and second pulse sequences for waveform and phase components of an RF signal;

combining said pulse sequences for said waveform and phase components of said RF signal into a composite RF pulse sequence;

determining the Hilbert transform of said composite RF pulse sequence;

selecting a gradient magnetic field phase encoding pulse sequence and a gradient magnetic field readout pulse sequence to be generated along first and second axes, respectively, of said object;

generating first and second RF signals, said first signal having said composite RF pulse sequence and said second signal having the Hilbert transform of said composite RF pulse sequence, said first and second generated RF signals producing transverse magnetization in said object;

generating said gradient magnetic field phase encoding pulse sequence and said gradient magnetic field readout pulse sequence along said first and second axes and a phase encoding gradient magnetic field along a third axis of said object to produce a first plane of k-space echoes;

said gradient magnetic field readout pulse sequence comprised of a series of pulse segments alternately having positive and negative amplitudes and said gradient magnetic field phase encoding pulse sequence comprised of a positive amplitude spike positioned at each transition between positive and negative amplitude pulse segments for said gradient magnetic field readout pulse sequence;

repeatedly stepping said phase encoding gradient magnetic field and generating said first and second RF pulse sequences, said gradient magnetic field readout pulse sequence, said gradient magnetic field readout pulse sequence and said stepped phase encoding gradient magnetic field to produce additional planes of k-space echoes; and producing an image of said object from said received echoes.

55. A method of producing an image of an object according to claim 54 and further comprising the step of randomly varying transmitter and receiver phases between successive generations of said repeated pulse sequences.

56. A method of producing an image of an object according to claim 54 wherein said gradient magnetic field readout pulse sequence is a square wave having equal positive and negative amplitudes.

57. A method of producing an image of an object according to claim 54 wherein said RF waveform pulse sequence is a sinusoidal function and said RF phase pulse sequence is a step function.

58. A method of producing an image of an object according to claim 54 wherein the step of selecting first and second pulse sequences for waveform and phase components of an RF signal further comprises the steps of:

selecting said first pulse sequence as defined by the equation $y = \sin x$, $0 \leq x \leq 4\pi$; and selecting said second pulse sequence as defined by the equation $y = 0$, $0 \leq x \leq 2\pi$, $y = \pi$, $2\pi \leq x \leq 4\pi$.

* * * * *